US010472717B2

(12) United States Patent
Sawachi et al.

(10) Patent No.: US 10,472,717 B2
(45) Date of Patent: Nov. 12, 2019

(54) GAS SUPPLY SYSTEM, PLASMA PROCESSING APPARATUS, AND OPERATION METHOD FOR PLASMA PROCESSING APPARATUS

(71) Applicant: Tokyo Electron Limited, Tokyo (JP)

(72) Inventors: Atsushi Sawachi, Miyagi (JP); Norikazu Sasaki, Miyagi (JP); Jun Yamashima, Miyagi (JP); Yoshiyasu Sato, Miyagi (JP); Kenichi Nogami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 242 days.

(21) Appl. No.: 15/327,405

(22) PCT Filed: Aug. 6, 2015

(86) PCT No.: PCT/JP2015/072372
§ 371 (c)(1),
(2) Date: Jan. 19, 2017

(87) PCT Pub. No.: WO2016/027685
PCT Pub. Date: Feb. 25, 2016

(65) Prior Publication Data
US 2017/0159180 A1 Jun. 8, 2017

(30) Foreign Application Priority Data

Aug. 20, 2014 (JP) .................................. 2014-167475
Nov. 11, 2014 (JP) .................................. 2014-229222

(51) Int. Cl.
*C23C 16/40* (2006.01)
*C23C 16/455* (2006.01)
(Continued)

(52) U.S. Cl.
CPC ...... *C23C 16/45561* (2013.01); *C23C 16/455* (2013.01); *C23C 16/45523* (2013.01);
(Continued)

(58) Field of Classification Search
CPC ........ C23C 16/45561; C23C 16/45587; C23C 16/45523; C23C 16/455; C23C 16/509;
(Continued)

(56) References Cited

U.S. PATENT DOCUMENTS

2005/0241763 A1* 11/2005 Huang .............. C23C 16/45561
156/345.33
2005/0249876 A1* 11/2005 Kawahara ......... C23C 16/45514
427/255.34
(Continued)

FOREIGN PATENT DOCUMENTS

CN 101276732 A 10/2008
CN 102341760 A 2/2012
(Continued)

OTHER PUBLICATIONS

International Search Report for PCT/JP2015/072372 dated Nov. 2, 2015.

*Primary Examiner* — Rudy Zervigon
(74) *Attorney, Agent, or Firm* — Pearne & Gordon LLP

(57) ABSTRACT

A gas supply system includes a first device to a third device. A plurality of integral units of the first device is configured to select one or more gases from one or more gas sources and supply the selected gases. The second device is configured to distribute plural gases from the integral units and supply the distributed gases while controlling flow rates of the distributed gases. The third device is configured to exhaust the gases within the gas supply system to a gas exhaust device.

21 Claims, 14 Drawing Sheets

(51) Int. Cl.
  *C23C 16/509*      (2006.01)
  *H01L 21/3065*     (2006.01)
  *H01L 21/02*       (2006.01)
  *H01L 21/67*       (2006.01)
  *H01J 37/32*       (2006.01)

(52) U.S. Cl.
  CPC ...... *C23C 16/45587* (2013.01); *C23C 16/509* (2013.01); *H01J 37/3244* (2013.01); *H01L 21/02274* (2013.01); *H01L 21/3065* (2013.01); *H01L 21/67017* (2013.01)

(58) Field of Classification Search
  CPC ........... H01J 37/3244; H01L 21/67017; H01L 21/02274; H01L 21/3065
  USPC ..................................... 118/715; 156/345.33
  See application file for complete search history.

(56)         References Cited

U.S. PATENT DOCUMENTS

2009/0117746 A1*  5/2009  Masuda ............ C23C 16/45561
                                                       438/710
2012/0031500 A1   2/2012  Hirose et al.

FOREIGN PATENT DOCUMENTS

| JP | 62-172719 A   | 7/1987  |
| JP | 01-184818 A   | 7/1989  |
| JP | 01/281138 A   | 11/1989 |
| JP | 05-343392 A   | 12/1993 |
| JP | 2013-051315 A | 3/2013  |
| JP | 2013-513028 A | 4/2013  |
| WO | 2011/071706 A1| 6/2011  |

* cited by examiner

FIG. 9

| | | PROCESS ST35 | | PROCESS ST37 | | PROCESS ST35 | | PROCESS ST37 | | PROCESS ST35 | | PROCESS ST37 | |
|---|---|---|---|---|---|---|---|---|---|---|---|---|---|
| | | KIND OF GAS | FLOW RATE (sccm) | KIND OF GAS | FLOW RATE (sccm) | KIND OF GAS | FLOW RATE (sccm) | KIND OF GAS | FLOW RATE (sccm) | KIND OF GAS | FLOW RATE (sccm) | KIND OF GAS | FLOW RATE (sccm) |
| GAS A | | $O_2$ | 75 | $O_2$ | 40 | $O_2$ | 40 | $O_2$ | 40 | $O_2$ | 40 | $O_2$ | 40 |
| | | Ar | 100 | Ar | 200 | Ar | 200 | Ar | 200 | Ar | 200 | Ar | 200 |
| | | $CF_4$ | 125 | | | | | $SiCl_4$ | 25 | $SiCl_4$ | 25 | $SiCl_4$ | 25 |
| GAS B | | $O_2$ | 40 | $O_2$ | 40 | $O_2$ | 75 | $O_2$ | 75 | $O_2$ | 40 | $O_2$ | 40 |
| | | Ar | 200 | Ar | 200 | Ar | 100 | Ar | 100 | Ar | 200 | Ar | 200 |
| | | $SiCl_4$ | 25 | $SiCl_4$ | 25 | $CF_4$ | 125 | $CF_4$ | 125 | | | | |

GAS SUPPLY SYSTEM, PLASMA PROCESSING APPARATUS, AND OPERATION METHOD FOR PLASMA PROCESSING APPARATUS

CROSS-REFERENCE TO RELATED APPLICATION

This Application is a U.S. national phase application under 35 U.S.C. § 371 of PCT Application No. PCT/JP2015/072372 filed on Aug. 6, 2015, which claims the benefit of Japanese Patent Application Nos. 2014-167475 and 2014-229222 filed on Aug. 20, 2014 and Nov. 11, 2014, respectively, the entire disclosures of which are incorporated herein by reference.

TECHNICAL FIELD

The various embodiments described herein pertain generally to a gas supply system, a plasma processing apparatus, and an operation method for the plasma processing apparatus.

BACKGROUND ART

In the manufacture of an electronic device such as a semiconductor device, a plasma processing is performed by using a plasma processing apparatus. For example, a processing such as etching or film formation is performed by exposing a processing target object to plasma.

In a process including the plasma processing, different kinds of plasma processings may be performed on the processing target object by changing gases supplied into a single processing vessel in sequence. To perform this process, the plasma processing apparatus needs to be equipped with a gas supply system capable of supplying different kinds of gases while changing them. As an example of the plasma processing apparatus including such a gas supply system, there is known a plasma processing apparatus described in Patent Document 1.

The plasma processing apparatus disclosed in Patent Document 1 is equipped with a processing vessel and a shower head. The shower head has a multiple number of gas discharging units through which gases are supplied toward different zones within the processing vessel, that is, toward a multiple number of concentric regions on the processing target object. The gases are supplied from the gas supply system into the multiple number of gas discharging units individually.

The gas supply system includes a plurality of flow rate control unit groups. Each flow rate control unit group includes a multiple number of flow rate control units. Each flow rate control unit belonging to the corresponding flow rate control unit group is connected to the corresponding one of the gas discharging units.

Further, the gas supply system is equipped with a multiple number of branch lines through which the gases are distributed to the corresponding flow rate control units of the individual flow rate control unit groups. In addition, the gas supply system has pipelines respectively connected to the multiple number of branch lines. Different kinds of multiple gas sources are connected to each of these pipelines via valves.

In the plasma processing apparatus recited in Patent Document 1, a gas from a gas source selected from the multiple gas sources connected to each pipeline via the valves is distributed into the multiple number of flow rate control unit groups, and the corresponding gas can be then supplied into the multiple number of gas discharging units from the multiple number of flow rate control unit groups. Further, by changing the kind of the gas to be supplied into each pipeline, it is possible to change the kind of the gas to be supplied to the multiple number of gas discharging units. Accordingly, different kinds of plasma processings can be performed on the processing target object within the single processing vessel.

Patent Document 1: Japanese Patent Laid-open Publication No. 2013-051315

In the gas supply system of the plasma processing apparatus described in Patent Document 1, when changing the gas to be supplied into the gas discharging units, it is required to replace the gas within the gas supply system. Since, however, it takes time to replace the gas, the throughput of the process is deteriorated.

DISCLOSURE OF THE INVENTION

Problems to be Solved by the Invention

In view of the foregoing, it is required to reduce the time period required to replace a gas within a gas supply system.

Means for Solving the Problems

In an exemplary embodiment, there is provided a gas supply system of supplying a gas into a plasma processing apparatus. The gas supply system includes a first device, a second device and a third device. The first device includes a plurality of integral units. Each of the integral units is configured to select one or more gases from one or more gas sources and supply the selected gases. The second device is configured to distribute plural gases from the integral units and supply the distributed gases while controlling flow rates of the distributed gases. The third device is configured to exhaust the gases from the gas supply system.

The first device includes a plurality of first pipelines, a plurality of first valves and a multiplicity of second pipelines. The first pipelines are respectively connected to the gas sources. The first valves are respectively provided at the corresponding first pipelines. The number of the second pipelines is smaller than the number of the first pipelines. Each of the integral units includes a single second pipeline among the second pipelines; one or more first pipelines, among the first pipelines, which are branched from the single second pipeline and respectively connected to one or more gas sources; and one or more first valves, among the first valves, which are provided at the one or more first pipelines.

The second device includes a plurality of flow rate control unit groups and a multiplicity of third pipelines. Each of the flow rate control unit groups includes multiple flow rate control units. The number of the flow rate control units is equal to the number of the second pipelines. The third pipelines are configured to distribute the gases from the second pipelines into corresponding flow rate control units of each of the flow rate control unit groups.

The third device includes a gas exhaust line, a multiplicity of fourth pipelines and a multiplicity of fourth valves. A second valve connected to a source of a purge gas and a third valve connected to a gas exhaust device are provided at the gas exhaust line. The fourth pipelines are configured to connect the gas exhaust line and the second pipelines individually between the second valve and the third valve. The fourth valves are respectively provided at the corresponding fourth pipelines.

In the present gas supply system, when replacing the gas within the gas supply system, by stopping the flow rate control units and closing the first valves while opening the second to fourth valves, the gas within the pipelines of the gas supply system can be exhausted from the gas exhaust line at a high speed. Accordingly, when changing the gas to be supplied from the gas supply system, a time period required to replace the gas within the gas supply system can be shortened.

In a first example of the gas supply system, the second device may further include a plurality of joint lines respectively connected to the flow rate control unit groups and each configured to merge the gases from the flow rate control units for the corresponding flow rate control unit group.

In a second example of the gas supply system, the second device may further include a multiplicity of first branch lines, a multiplicity of second branch lines, a multiplicity of fifth valves, a multiplicity of sixth valves, a plurality of first joint lines and a plurality of second joint lines. The first branch lines are respectively connected to the corresponding flow rate control units. The second branch lines are respectively connected to the corresponding flow rate control units. That is, an output of each flow rate control unit is branched into the first branch line and the second branch line. The fifth valves are respectively provided at the first branch lines. The sixth valves are respectively provided at the second branch lines. The first joint lines are respectively connected to the flow rate control unit groups, and each of the first joint lines is configured to merge the gases from the first branch lines for the corresponding flow rate control unit group. The second joint lines are respectively connected to the flow rate control unit groups, and each of the second joint lines is configured to merge the gases from the second branch lines for the corresponding flow rate control unit group.

In the examples, the gas supply system may further include a pressure gauge connected to the gas exhaust line. By measuring the pressure of the gas exhaust line through this pressure gauge, it is possible to determine whether the exhaust of the gas is completed.

In the examples, the pressure gauge may be connected to the gas exhaust line at an upstream side of the third valve. In this configuration, by closing the first to third valves and opening the fourth valves, it is possible to detect a leakage of the first valves from a measurement result of the pressure of the gas exhaust line obtained by the pressure gauge.

In other exemplary embodiments, there is provided a plasma processing apparatus configured to perform a plasma processing on a processing target object.

A plasma processing apparatus according to a first exemplary embodiment includes a gas supply system according to the first example; a processing vessel in which a space for accommodating the processing target object therein is provided; and a plurality of gas discharging units. The number of the gas discharging units is equal to the number of the flow rate control unit groups. The gas discharging units are configured to discharge gases into a plurality of zones within the processing vessel. The corresponding joint lines of the gas supply system are respectively connected to the gas discharging units.

In the plasma processing apparatus of the first exemplary embodiment, since the gas within the gas supply system can be replaced at a high speed, it is possible to change the gas to be supplied into the processing vessel at a high speed. Accordingly, the throughput of the process in which different kinds of plasma processings are performed on the processing target object alternately can be improved.

The plasma processing apparatus may further include a turbo molecular pump connected to the processing vessel and a dry pump provided downstream of the turbo molecular pump. The gas exhaust line may be connected to a pipeline between the turbo molecular pump and the dry pump at a downstream side of the third valve. According to the present exemplary embodiment, it is possible to suppress a backflow of the gas into the processing vessel.

A plasma processing apparatus according to a second exemplary embodiment includes a gas supply system according to the second example; a processing vessel in which a space for accommodating the processing target object therein is provided; a plurality of gas discharging units; a turbo molecular pump and a dry pump. The number of the gas discharging units is equal to the number of the flow rate control unit groups. The gas discharging units are configured to discharge gases into a plurality of zones within the processing vessel. The turbo molecular pump is connected to the processing vessel. The dry pump is provided downstream of the turbo molecular pump. The first joint lines are respectively connected to the gas discharging units via a plurality of seventh valves and respectively connected to a pipeline between the turbo molecular pump and the dry pump via a plurality of eighth valves. The second joint lines are respectively connected to the gas discharging units via a plurality of ninth valves and respectively connected to the pipeline between the turbo molecular pump and the dry pump via a plurality of tenth valves.

In the plasma processing apparatus of the second exemplary embodiment, a gas from the first joint lines and a gas from the second joint lines can be supplied into the processing vessel alternately, and the gas, which is not supplied into the processing vessel, can be flown to an exhaust side. Accordingly, it is possible to change the gas to be supplied into the processing vessel at a high speed. Therefore, the throughput of the process in which different kinds of plasma processings are performed on the processing target object alternately can be improved. Furthermore, according to the plasma processing apparatus of the present exemplary embodiment, the gas from the first joint lines can be supplied into the processing vessel continuously, and the gas from the second joint lines can be supplied into the processing vessel intermittently, that is, in a pulse shape. In this case, the gas from the second joint lines may be different from or the same as the gas from the first joint lines.

In the exemplary embodiments, the plasma processing apparatus may further include a shower head and another gas exhaust line. The shower head is provided with the gas discharging units. The another gas exhaust line is connected to the shower head and to a pipeline between the processing vessel and the turbo molecular pump. Further, the another gas exhaust line is provided with an eleventh valve. In this case, when replacing the gas, it is possible to exhaust the gas within the shower head through the another gas exhaust line.

In the exemplary embodiments, the plasma processing apparatus may further include another gas exhaust line, having an eleventh valve, configured to connect a first gas discharging unit among the gas discharging units and a second gas discharging unit, among the gas discharging units, having a conductance higher than a conductance of the first gas discharging unit. In this case, when replacing the gas, the gas can be flown from a gas discharging unit having a lower conductance to a gas discharging unit having a higher conductance through the another gas exhaust line, and the gas within the shower head can be exhausted from the gas discharging unit having the higher conductance.

A plasma processing apparatus according to a third exemplary embodiment further includes a first processing vessel, a second processing vessel, a plurality of gas discharging units, a plurality of other gas discharging units and a gas supply system according to the second example. Each of the first processing vessel and the second processing vessel provides a space for accommodating the processing target object therein. The gas discharging units are configured to discharge gases into a plurality of zones within the first processing vessel. The other gas discharging units are configured to discharge gases into a plurality of zones within the second processing vessel. The first joint lines are respectively connected to the gas discharging units, and the second joint lines are respectively connected to the other gas discharging units.

In the plasma processing apparatus of the third exemplary embodiment, individual gases can be supplied into two processing vessels, i.e., reactors. Thus, the same or different kinds of plasma processings can be performed in the two processing vessels at the same time or at different times.

The plasma processing apparatus may include a first turbo molecular pump connected to the first processing vessel; a first dry pump provided downstream of the first turbo molecular pump; a second turbo molecular pump connected to the second processing vessel; and a second dry pump provided downstream of the second turbo molecular pump. The gas exhaust line may be connected, at a downstream side of the third valve, to a pipeline between the first turbo molecular pump and the first dry pump, or to a pipeline between the second turbo molecular pump and the second dry pump.

In the plasma processing apparatus according to any one of the exemplary embodiments, the gas supply system may further include a pressure gauge connected to the gas exhaust line. Further, the pressure gauge may be connected to the gas exhaust line at an upstream side of the third valve.

In still other exemplary embodiments, there is provided an operation method for the plasma processing apparatus.

An operation method according to a first exemplary embodiment is provided for replacing a gas within the gas supply system in a plasma processing apparatus of any one of the first to third exemplary embodiments. The gas supply system of the plasma processing apparatus further includes a pressure gauge connected to the gas exhaust line. The operation method includes (a1) stopping the flow rate control units; (b1) closing the first valves; (c1) opening the second valve, the third valve and the fourth valves; (d1) closing the second valve, the third valve and the fourth valves when a pressure of the gas exhaust line measured by the pressure gauge is equal to or less than a threshold value; (e1) opening a first valve, among the first valves, which is connected to a preset gas source; and (f1) controlling a flow rate of a gas by the flow rate control units. In the opening of the second valve, the third valve and the fourth valves, primary valves provided in the flow rate control units may be further opened.

In the operation method of the first exemplary embodiment, when changing the gas to be supplied into the processing vessel, the gas within the gas supply system can be exhausted from the gas exhaust line at a high speed. Accordingly, when changing the gas to be supplied from the gas supply system, a time period required to replace the gas within the gas supply system can be shortened.

An operation method according to a second exemplary embodiment is provided for detecting a leakage of the first valves in a plasma processing apparatus of any one of the first to third exemplary embodiments. The gas supply system of the plasma processing apparatus further includes a pressure gauge connected to the gas exhaust line, and the pressure gauge may be connected to the gas exhaust line at an upstream side of the third valve. The operation method includes (a2) stopping the flow rate control units; (b2) closing the first valves, the second valve and the third valve; (c2) opening the fourth valves; and (d2) measuring a pressure of the gas exhaust line by the pressure gauge.

In the operation method of the second exemplary embodiment, the leakage of the first valves can be detected based on a pressure of the gas exhaust line which is measured by the pressure gauge.

An operation method according to a third exemplary embodiment is for a plasma processing apparatus of the second exemplary embodiment, and includes (a3) a first process of closing the second valve, the third valve and the fourth valves; (b3) a second process of opening a preset first valve among the first valves; (c3) a third process of adjusting a flow rate of a gas by the flow rate control units; (d3) a fourth process of opening either one of the fifth valve provided at each of the first branch lines or the sixth valve provided at each of the second branch lines, each of the first branch line and the second branch line being connected to corresponding one of the flow rate control units; (e3) a fifth process of opening the seventh valves while closing the eighth valves, and closing the ninth valves while opening the tenth valves; and (f3) a sixth process of opening the ninth valves while closing the tenth valves, and closing the seventh valves while opening the eighth valves. The fifth process and the sixth process are repeated alternately.

In the operation method of the third exemplary embodiment, a gas from the first joint lines and a gas from the second joint lines can be supplied into the processing vessel alternately, and the gas, which is not supplied into the processing vessel, can be flown to an exhaust side. Accordingly, it is possible to change the gas to be supplied into the processing vessel at a high speed. Therefore, the throughput of the process in which different kinds of plasma processings are performed on the processing target object alternately can be improved.

The plasma processing apparatus may further include a shower head provided with the gas discharging units; and another gas exhaust line, having an eleventh valve, connected to the shower head and to a pipeline between the processing vessel and the turbo molecular pump. The operation method may further include (g3) a seventh process of closing the seventh valves, the eighth valves and the ninth valves while opening the tenth valves and the eleventh valve after the fifth process and before the sixth process, and (h3) an eighth process of closing the seventh valves, the ninth valves and the tenth valves while opening the eighth valves and the eleventh valve after the sixth process and before the fifth process. According to the present exemplary embodiment, when replacing the gas, it is possible to exhaust the gas within the shower head through the another gas exhaust line having the eleventh valve at a high speed.

The plasma processing apparatus may further include another gas exhaust line, having an eleventh valve, configured to connect a first gas discharging unit among the gas discharging units and a second gas discharging unit having a conductance higher than a conductance of the first gas discharging unit. The operation method may further include (i3) a seventh process of closing the seventh valves, the eighth valves and the ninth valves while opening the tenth valves and the eleventh valve after the fifth process and before the sixth process, and (j3) an eighth process of closing the seventh valves, the ninth valves and the tenth valves while opening the eighth valves and the eleventh valve after the sixth process and before the fifth process. According to the present exemplary embodiment, when replacing the gas, the gas can be flown from a gas discharging unit having a lower conductance to a gas discharging unit having a higher conductance through the another gas exhaust line, and the gas within the shower head can be exhausted from the gas discharging unit having the higher conductance.

An operation method according to a fourth exemplary embodiment is for a plasma processing apparatus of the third exemplary embodiment, and includes (a4) a first process of closing the second valve, the third valve and the fourth valves; (b4) a second process of opening a preset first valve among the first valves; (c4) a third process of adjusting a flow rate of a gas by the flow rate control units; (d4) a fourth process of opening either one of the fifth valve provided at each of the first branch lines or the sixth valve provided at each of the second branch lines, each of the first branch line and the second branch line being connected to corresponding one of the flow rate control units; (e4) a fifth process of opening the seventh valves while closing the eighth valves; (f4) a sixth process of closing the ninth valves and the tenth valves; and (g4) a seventh process of opening the ninth valves. The sixth process and the seventh process are repeated alternately.

In the operation method of the fourth exemplary embodiment, over the sixth process and the seventh process, a gas from the first joint lines can be supplied into the processing vessel, and a supply and a stop of the supply of a gas from the second joint lines into the processing vessel can be alternately repeated. Further, the gas from the first joint lines and the gas from the second joint lines may be of different kinds or of the same kind.

Effect of the Invention

As stated above, according to the exemplary embodiments, it is possible to reduce a time period required to replace a gas within a gas supply system.

BRIEF DESCRIPTION OF THE DRAWINGS

FIG. 9 is a table showing an example of a gas A used in a process ST35 and an example of a gas B used in a process ST37.

DETAILED DESCRIPTION

Figure 1:
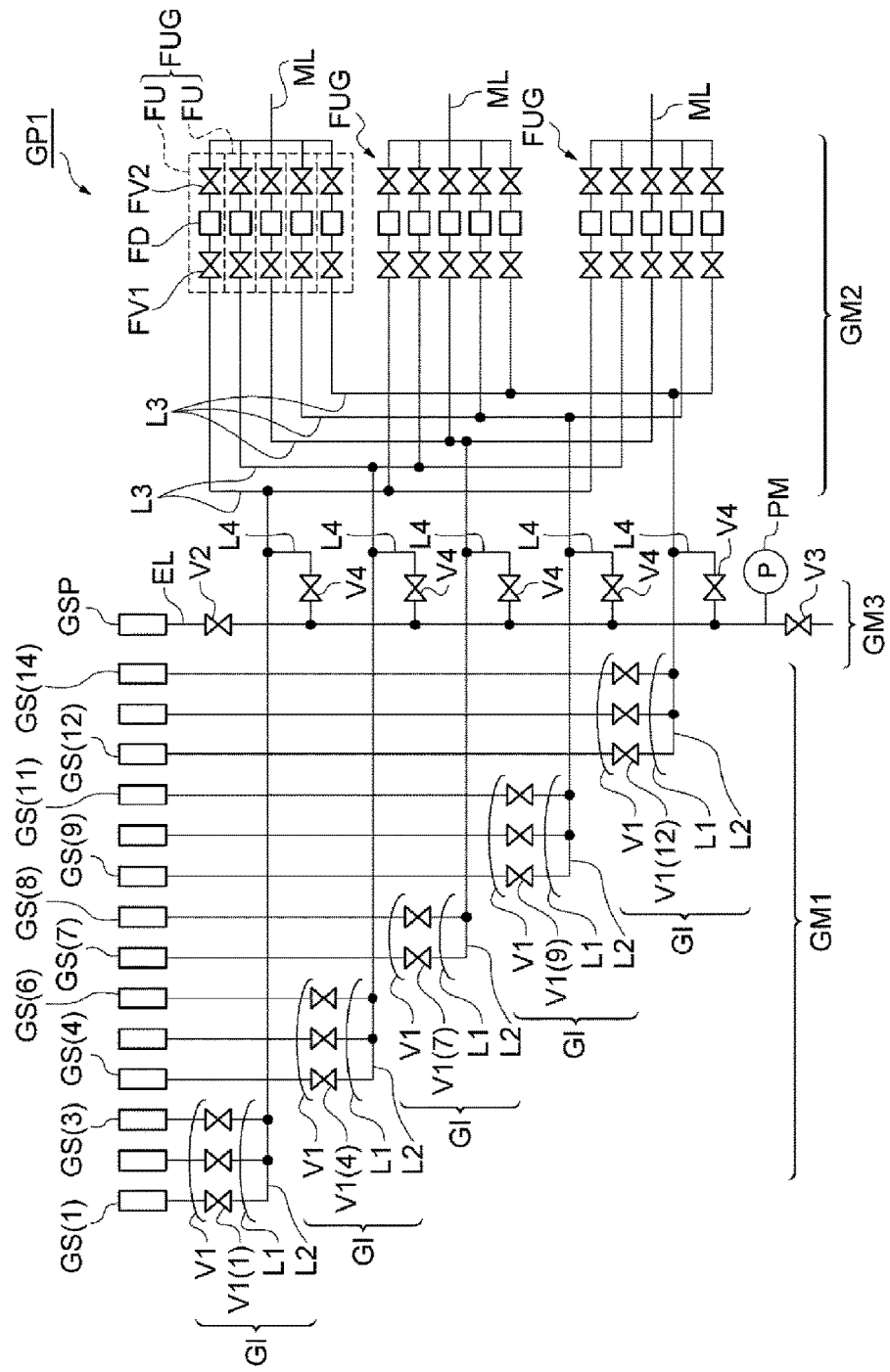
FIG. 1 is a diagram illustrating a gas supply system according to an exemplary embodiment.

In the following, exemplary embodiments will be described in detail, and reference is made to the accompanying drawings, which form a part of the description. Throughout the drawings, same or corresponding parts will be assigned same reference numerals.

FIG. 1 is a diagram illustrating a gas supply system according to an exemplary embodiment. The gas supply system GP1 shown in FIG. 1 includes a first device GM1, a second device GM2 and a third device GM3.

The first device GM1 includes a plurality of integral units GI. In the present exemplary embodiment, the first device GM1 includes five (5) integral units GI. Here, however, the number of the integral units GI is not limited thereto. The first device GM1 is configured to supply gases selected from the respective integral units GI through individual pipelines.

The first device GM1 includes multiple pipelines L1 (first pipelines L1), multiple valves V1 (first valves V1) and multiple pipelines L2 (second pipelines L2). Each of the multiple pipelines L1 is equipped with each corresponding one of the multiple valves V1, respectively. Further, the multiple pipelines L1 are respectively connected to multiple gas sources GS.

In the present exemplary embodiment, the multiple gas sources GS include fourteen (14) gas sources, i.e., gas sources GS(1) to GS(14). However, the number of the gas sources GS is not limited to this example. As one example, the gas sources GS(1) to GS(14) are a source of a $C_4F_8$ gas, a source of a $C_4F_6$ gas, a source of a He gas, a source of a $CF_4$ gas, a source of a $CH_4$ gas, a source of a CO gas, a source of a COS gas, a source of a $N_2$ gas, a source of a $NF_3$ gas, a source of a $CHF_3$ gas, a source of an Ar gas, a source of a $CH_2F_2$ gas, and a source of a $CO_2$ gas.

Each of the integral units GI includes one of the multiple pipelines L2; one or more pipelines L1 branched from the one pipeline L2 and respectively connected to one or more gas sources GS; and one or more valves V1 respectively provided on the one or more pipelines L1. Each integral unit GI is connected to the one or more gas sources which are not used concurrently. Each integral unit GI is capable of supplying a gas from a gas source selected from the one or more gas sources connected to this integral unit GI.

In the example shown in FIG. 1, three pipelines L1 respectively connected to the gas sources GS(1) to GS(3), three valves V1 respectively provided on these pipelines L1 and a single pipeline L2 to which the three pipelines L1 are connected constitute a single integral unit GI. Further, three pipelines L1 respectively connected to the gas sources GS(4) to GS(6), three valves V1 respectively provided on these pipelines L1 and a single pipeline L2 to which the three pipelines L1 are connected constitute another single integral unit GI. Further, two pipelines L1 respectively connected to the gas sources GS(7) and GS(8), two valves V1 respectively provided on these pipelines L1 and a single pipeline L2 to which the two pipelines L1 are connected constitute another single integral unit GI. Furthermore, three pipelines L1 respectively connected to the gas sources GS(9) to GS(11), three valves V1 respectively provided on these pipelines L1 and a single pipeline L2 to which the three pipelines L1 are connected constitute another single integral unit GI. In addition, three pipelines L1 respectively connected to the gas sources GS(12) to GS(14), three valves V1 respectively provided on these pipelines L1 and a single pipeline L2 to which the three pipelines L1 are connected constitute still another single integral unit GI.

The second device GM2 is provided downstream of the first device GM1. The second device GM2 is configured to distribute multiple gases from the integral units GI and supply the gases while controlling the flow rates thereof.

The second device GM2 includes multiple flow rate control unit groups FUG and multiple pipelines L3 (third pipelines L3). The number of the multiple flow rate control unit groups FUG is the same as the number of gas discharging units of the plasma processing apparatus to be described later. In the example shown in FIG. 1, the number of the flow rate control unit groups FUG is three. Here, the number of the flow rate control unit groups FUG and the number of the gas discharging units are not particularly limited as long as they are plural.

Each of the flow rate control unit groups FUG includes multiple flow rate control units FU. The number of the multiple flow rate control units FU is the same as the number of the pipelines L2. Each flow rate control unit FU includes a flow rate controller such as a mass flow controller between a pair of valves. That is, each flow rate control unit FU includes a primary valve FV1, a secondary valve FV2 and a flow rate controller FD, and the flow rate controller FD is provided between the primary valve FV1 and the secondary valve FV2. Each flow rate control unit FU is configured to adjust a flow rate of a gas supplied thereto. Further, the flow rate controller FD is not limited to the mass flow controller, but may be implemented by a pressure type flow rate controller.

Through each of the multiple pipelines L3, the gas from the corresponding one of the pipelines L2 is distributed into the multiple flow rate control unit groups FUG and is supplied into the corresponding flow rate control unit FU belonging to each of the flow rate control unit groups FUG. Thus, each of the pipelines L3 is branched into multiple pipelines. The number of the branched pipelines of the single pipeline L3 is the same as the number of the flow rate control unit groups FUG.

In the present exemplary embodiment, the second device GM2 further includes multiple joint lines ML. Each of the joint lines ML is configured to merge the gases from the multiple flow rate control units FU belonging to the corresponding one of the flow rate control unit groups FUG. Thus, each joint line ML is configured to be merged into a single pipeline from multiple pipelines. The number of the pipelines that joins each joint line ML is the same as the number of the pipelines L2 and the number of the flow rate control units FU belonging to the flow rate control unit group FUG.

The third device GM3 is configured as an exhaust device of the gas supply system GP1. The third device GM3 includes a gas exhaust line EL, a plurality of pipelines L4 (fourth pipelines L4) and multiple valves V4 (fourth valves V4).

The gas exhaust line EL is provided with a valve V2 (second valve V2) and a valve V3 (third valve V3). The valve V2 is provided at an upstream side of the gas exhaust line EL, and the valve V3 is provided at a downstream side of the gas exhaust line EL. At the upstream side thereof, the gas exhaust line EL is connected to a gas source GSP for a purge gas via the valve V2. The purge gas is an inert gas such as, but not limited to, a $N_2$ gas. Further, at the downstream side thereof, the gas exhaust line EL is connected to a gas exhaust device via the valve V3. In the present exemplary embodiment, the gas exhaust line EL is connected to a pipeline between a turbo molecular pump and a dry pump of the plasma processing apparatus. Further, as will be described later, the turbo molecular pump may be connected to the processing vessel, and the dry pump may be provided downstream of the turbo molecular pump in the plasma processing apparatus.

The pipelines L4 are configured to connect the gas exhaust line EL and the multiple pipelines L2. Each pipeline L4 is provided with the corresponding one of the valves V4.

In the present exemplary embodiment, the gas exhaust line EL is connected to a pressure gauge PM. The pressure gauge PM is configured to measure a pressure of a flow path within the gas exhaust line EL. In the present exemplary embodiment, the pressure gauge PM is connected to the gas exhaust line EL at an upstream side of the valve V3, that is, at a position closer to the valve V3 than the valve V2. Further, the pressure gauge PM may be provided upstream of the valve V3 and downstream of joint positions between the pipelines L4 and the gas exhaust line EL.

In the gas supply system GP1 according to the present exemplary embodiment, the valve V2, the valve V3 and all the valves V4 are closed, and, a required single valve V1 among the valves V1 of the integral units GI is opened. Then, a flow rate of a required gas is controlled by the flow rate control units FU of the flow rate control unit groups FUG, so that the required gas can be supplied through each joint line ML.

Further, when changing the gas to be supplied from the gas supply system GP1, the operations of the flow rate control units FU of the flow rate control unit groups FUG are stopped. Then, all the valves V1 are closed, whereas the valve V2, the valve V3 and all the valves V4 are opened. With this operation, the gas remaining in the flow path from each of the valves V1 to each of the flow rate control units FU can be exhausted through the gas exhaust line EL at a high speed. Furthermore, in case that the flow rate controller FD within each flow rate control unit FU is the pressure type flow rate controller, by opening the primary valve FV1 within each flow rate control unit FU when closing all the valves V1 and opening the valve V2, the valve V3 and all the valves V4, the gas remaining in a gas line within each flow rate control unit FU can also be exhausted at a high speed.

Subsequently, the valve V2, the valve V3 and all the valves V4 are closed, and, a required single valve V1 among the valves V1 of the integral units GI is opened. Accordingly, a changed gas can be supplied while its flow rate is controlled by the flow rate control units FU of the flow rate control unit groups FUG. As stated, in the gas supply system GP1, the gas within the flow paths of the gas supply system GP1 can be replaced at a high speed, that is, in a short time period.

Figure 2:
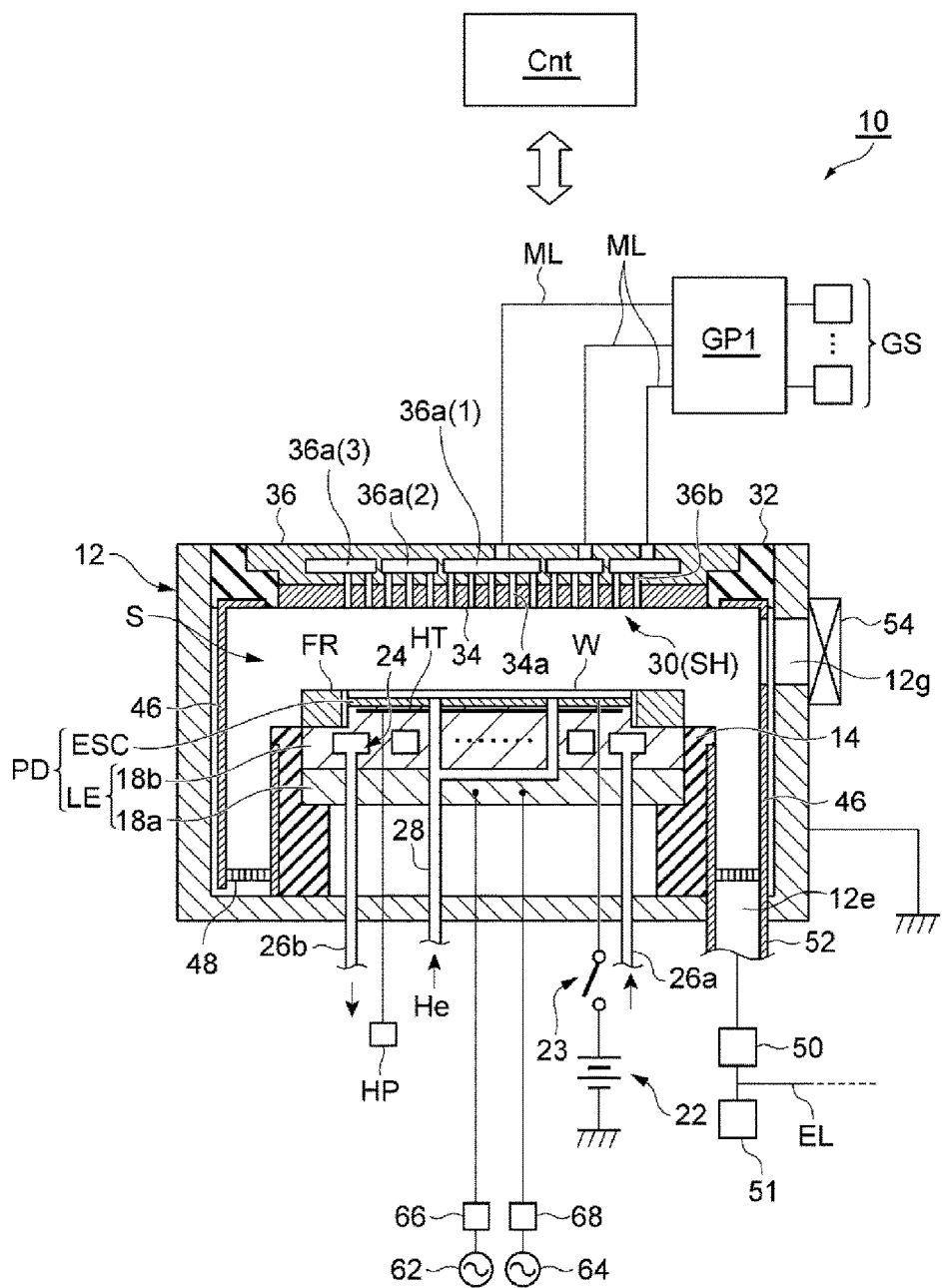
FIG. 2 is a diagram schematically illustrating a plasma processing apparatus according to the exemplary embodiment.

Now, a plasma processing apparatus equipped with the gas supply system GP1 will be explained according to the exemplary embodiment. FIG. 2 is a diagram schematically illustrating the plasma processing apparatus according to the exemplary embodiment. The plasma processing apparatus 10 shown in FIG. 2 is configured as a capacitively coupled plasma etching apparatus and is equipped with the gas supply system GP1.

The plasma processing apparatus 10 includes a processing vessel 12. The processing vessel 12 has a substantially cylindrical shape. The processing vessel 12 is made of, but not limited to, aluminum, and an inner wall surface thereof is anodically oxidized. Further, the processing vessel 12 is frame-grounded. Further, a carry-in/out opening 12g for a processing target object (hereinafter, referred to as "wafer W") is formed through a sidewall of the processing vessel 12. The carry-in/out opening 12g is opened or closed by a gate valve 54.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported by the supporting member 14.

The mounting table PD is configured to hold the wafer W on a top surface thereof. The mounting table PD includes a lower electrode LE and an electrostatic chuck ESC. The lower electrode LE is provided with a first plate 18a and a second plate 18b. The first plate 18a and the second plate 18b are made of a metal such as, but not limited to, alumi aluminum and have a substantially disk shape. The second plate 18b is provided on the first plate 18a and electrically connected with the first plate 18a.

The electrostatic chuck ESC is provided on the second plate 18b. The electrostatic chuck ESC includes a pair of insulating layers or insulating sheets; and an electrode, which serves as a conductive film, embedded therebetween. The electrode of the electrostatic chuck ESC is electrically connected to a DC power supply 22 via a switch 23. The electrostatic chuck ESC is configured to attract the wafer W by an electrostatic force such as a Coulomb force generated by a DC voltage applied from the DC power supply 22. Accordingly, the electrostatic chuck ESC is capable of holding the wafer W.

A focus ring FR is provided on a peripheral portion of the second plate 18b to surround an edge of the wafer W and the electrostatic chuck ESC. The focus ring FR is configured to improve etching uniformity. The focus ring FR is made of a material which is appropriately selected depending on a material of an etching target film. For example, the focus ring FR may be made of quartz.

A coolant path 24 is provided within the second plate 18b. The coolant path 24 constitutes a temperature controller. A coolant is supplied into the coolant path 24 from a chiller unit provided outside the processing vessel 12 via a pipeline 26a. The coolant supplied into the coolant path 24 is then returned back into the chiller unit via a pipeline 26b. In this way, the coolant is supplied to circulate through the coolant path 24. A temperature of the wafer W held by the electrostatic chuck ESC is controlled by adjusting a temperature of the coolant.

Furthermore, the plasma processing apparatus 10 is provided with a gas supply line 28. Through the gas supply line 28, a heat transfer gas, e.g., a He gas, is supplied from a heat transfer gas supply device into a gap between a top surface of the electrostatic chuck ESC and a rear surface of the wafer W.

The plasma processing apparatus 10 is also equipped with a heater HT as a heating device. The heater HT is embedded in, for example, the second plate 18b, and is connected to a heater power supply HP. As a power is supplied to the heater HT from the heater power supply HP, the temperature of the mounting table PD is adjusted, and, thus, the temperature of the wafer W placed on the mounting table PD is adjusted. Alternatively, the heater HT may be embedded in the electrostatic chuck ESC.

Further, the plasma processing apparatus 10 includes an upper electrode 30. The upper electrode 30 is provided above the mounting table PD, facing the mounting table PD. The lower electrode LE and the upper electrode 30 are arranged to be substantially parallel to each other. Formed between the upper electrode 30 and the lower electrode LE is a processing space S in which a plasma processing is performed on the wafer W.

The upper electrode 30 is supported at an upper portion of the processing vessel 12 with an insulating shield member 32 therebetween. The upper electrode 30 is configured such that a distance from the top surface of the mounting table PD, i.e., a mounting surface on which the wafer W is placed is variable in a vertical direction. The upper electrode 30 may include an electrode plate 34 and an electrode supporting body 36. The electrode plate 34 faces the processing space S, and is provided with a multiple number of gas discharge holes 34a. In the exemplary embodiment, the electrode plate 34 is made of silicon.

The electrode supporting body 36 is configured to support the electrode plate 34 in a detachable manner, and is made of a conductive material such as, but not limited to, aluminum. The electrode supporting body 36 may have a water-cooling structure. A plurality of gas diffusion spaces 36a is formed within the electrode supporting body 36. The gas diffusion spaces 36a are arranged in a concentric manner with respect to a vertically extended axis line which passes through a center of the wafer W, i.e., a center of the mounting table PD. As depicted in FIG. 2, each of the gas diffusion spaces 36a is connected to each corresponding one of the multiple joint lines ML belonging to the gas supply system GP1.

In the example shown in FIG. 2, the gas diffusion space 36a includes three diffusion spaces, that is, a gas diffusion space 36a(1), a gas diffusion space 36a(2) and a gas diffusion space 36a(3). The gas diffusion space 36a(1) is arranged on the aforementioned axis line, and may have a circular plane shape when viewed from the vertical direction. The gas diffusion space 36a(2) is annularly extended at the outside of the gas diffusion space 36a(1). Further, the gas diffusion space 36a(3) is annularly extended at the outside of the gas diffusion space 36a(2).

As illustrated in FIG. 2, the electrode supporting body 36 is provided with a multiple number of communication holes extended downwards from each of the gas diffusion spaces 36a. The communication holes allow the gas discharge holes 34a to communicate with the corresponding gas diffusion spaces 36a. The upper electrode 30 having this configuration serves as a shower head SH according to the exemplary embodiment.

In the shower head SH, a single gas diffusion space 36a and multiple gas discharge holes connected to this gas diffusion space 36a constitute a single gas discharging unit. Accordingly, the shower head SH is provided with plural gas discharging units. From these plural gas discharging units, a gas can be supplied toward different zones within the processing vessel 12, that is, toward different regions on the wafer W in a radial direction.

Further, in the plasma processing apparatus 10, a deposition shield 46 is detachably provided along the inner wall of the processing vessel 12. The deposition shield 46 is also provided on an outer side surface of the supporting member 14. The deposition shield 46 is configured to suppress an etching byproduct (deposit) from adhering to the processing vessel 12, and may be formed of an aluminum member coated with ceramics such as $Y_2O_3$.

At the bottom portion of the processing vessel 12, a gas exhaust plate 48 is provided between the supporting member 14 and the sidewall of the processing vessel 12. The gas exhaust plate 48 may be made of, by way of example, an aluminum member coated with ceramic such as $Y_2O_3$. The processing vessel 12 is also provided with a gas exhaust opening 12e under the gas exhaust plate 48, and the gas exhaust opening 12e is connected with a gas exhaust device 50 and a gas exhaust device 51 via a gas exhaust line 52. In the exemplary embodiment, the gas exhaust device 50 is, for example, a turbo molecular pump, and the gas exhaust device 51 is, for example, a dry pump. The gas exhaust device 50 is provided at the upstream side of the gas exhaust device 51 with respect to the processing vessel 12. The gas exhaust line EL of the gas supply system GP1 is connected to a pipeline between the gas exhaust device 50 and the gas exhaust device 51. Since the gas exhaust line EL is connected between the gas exhaust device 50 and the gas exhaust device 51, a backflow of the gas from the gas exhaust line EL into the processing vessel 12 can be suppressed.

The plasma processing apparatus 10 further includes a first high frequency power supply 62 and a second high frequency power supply 64. The first high frequency power supply 62 is configured to generate a first high frequency power for plasma generation. Further, the first high frequency power supply 62 generates the first high frequency power having a frequency ranging from 27 MHz to 100 MHz, e.g., 40 MHz. The first high frequency power supply 62 is connected to the lower electrode LE via a matching device 66. The matching device 66 is a circuit configured to match an output impedance of the first high frequency power supply 62 and an input impedance at a load side (lower electrode LE).

The second high frequency power supply 64 is configured to generate a second high frequency power for ion attraction into the wafer W, i.e., a high frequency bias power having a frequency ranging from 400 kHz to 13.56 MHz, e.g., 3.2 MHz. The second high frequency power supply 64 is connected to the lower electrode LE via a matching device 68. The matching device 68 is a circuit configured to match an output impedance of the second high frequency power supply 64 and the input impedance at the load side (lower electrode LE).

Further, in the exemplary embodiment, the plasma processing apparatus 10 further includes a controller Cnt. The controller Cnt is a computer including a processor, a memory unit, an input device, a display device, and so forth, and is configured to control individual components of the plasma processing apparatus 10. To be specific, the controller Cnt controls the individual components of the plasma processing apparatus 10 such that the plasma processing apparatus 10 is operated according to an operation method to be described below.

The plasma processing apparatus 10 is configured to generate plasma by exciting the gas supplied into the processing vessel 12. Further, the wafer W may be processed by active species. Furthermore, different gases can be supplied into the processing vessel 12 at a high speed by the gas supply system GP1. Accordingly, the throughput of a process where different kinds of plasma processings are performed on the wafer W alternately can be improved.

Figure 3:
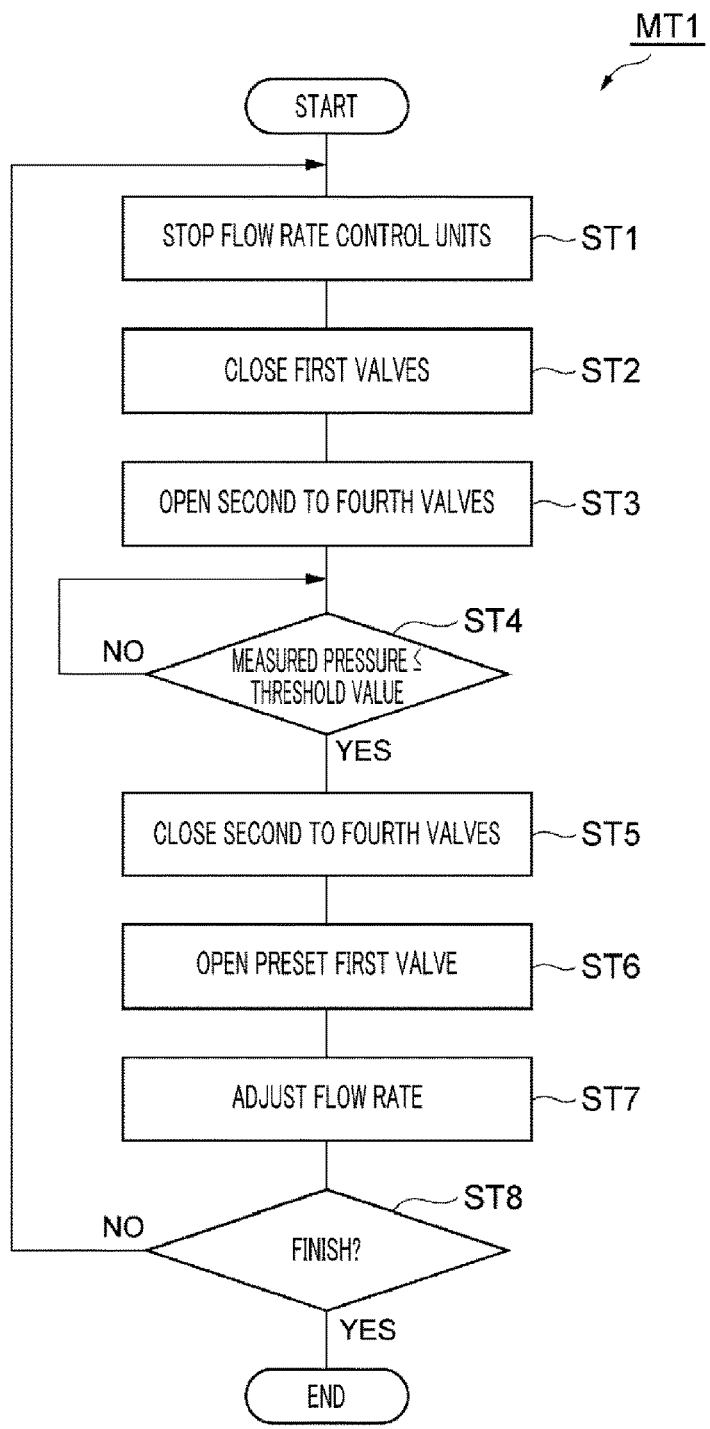
FIG. 3 is a flowchart for describing an example of an operation method for the plasma processing apparatus according to the exemplary embodiment.

Hereinafter, examples of the operation method for the plasma processing apparatus 10 will be explained. FIG. 3 is a flowchart for describing an example of the operation method for the plasma processing apparatus. The operation method MT1 shown in FIG. 3 includes several processes for exhausting a gas within the gas supply system GP1. Further, according to the operation method MT1, by supplying different kinds of gases into the processing vessel 12 of the plasma processing apparatus 10 in sequence after replacing the gases within the gas supply system GP1, different kinds of plasma processings can be performed on the wafer W. FIG. 3 shows a sequence of the operation method in which the remaining gas within the gas supply system GP1 is exhausted and a gas is supplied into the processing vessel 12.

Specifically, according to the operation method MT1, the gas within the gas supply system GP1 is exhausted in processes ST1 to ST4. In the process ST1, the operations of all the flow rate control units FU of the flow rate control unit groups FUG are stopped. In the subsequent process ST2, all the valves V1 are closed. Accordingly, the supply of the gas into the gas supply system GP1 from all of the gas sources GS is stopped. In the subsequent process ST3, the valve V2, the valve V3 and all the valves V4 are opened. Accordingly, the gas flowing in the pipelines from the valves V1 to all of the flow rate control units FU is exhausted through the gas exhaust line EL.

In the subsequent process ST4, a pressure of the flow path within the gas exhaust line EL is measured by the pressure gauge PM. In the process ST4, it is also detected whether the pressure of the flow path within the gas exhaust line EL is equal to or less than a threshold value. The threshold value is, for example, 500 mTorr (66.66 Pa). In case that the pressure of the flow path within the gas exhaust line EL is larger than the threshold value, the gas exhaust is continued. Meanwhile, if the pressure of the flow path within the gas exhaust line EL is equal to or less than the threshold value, it is determined that the gas exhaust of the gas supply system GP1 is completed, and then, a subsequent process ST5 is performed.

In the subsequent process ST5, the valve V2, the valve V3 and all the valves V4 are closed. In a subsequent process ST6, among the multiple valves V1, a single valve V1 connected to a required gas source GS is opened. In a subsequent process ST7, a flow rate of the corresponding gas is controlled by the multiple flow rate control units FU. With these operations, a required gas is supplied into the processing vessel 12. Then, the gas is excited, and the wafer W is processed by active species.

Then, in a subsequent process ST8, it is determined whether the processing is finished. If the processing is not finished, that is, if another processing with different gas is to be performed, the processings from the process ST1 are repeated. Meanwhile, if it is determined in the process ST8 that the processing is finished, the operation method MT1 is ended. Further, to conduct the processes ST1 to ST8, the individual components of the plasma processing apparatus 10 related to these processes may be controlled by the controller Cnt.

According to the operation method MT1, when changing the gas to be supplied into the processing vessel 12, the gas remaining in the gas supply system GP1 can be exhausted through the gas exhaust line at a high speed. Accordingly, when changing the gas to be supplied from the gas supply system GP1, the time period required to replace the gas within the gas supply system GP1 can be shortened. As a result, the process in which different kinds of gases are used in sequence can be performed with high throughput. Furthermore, this operation method MT1 may be still applicable to various other plasma processing apparatuses to be described later.

Figure 13:
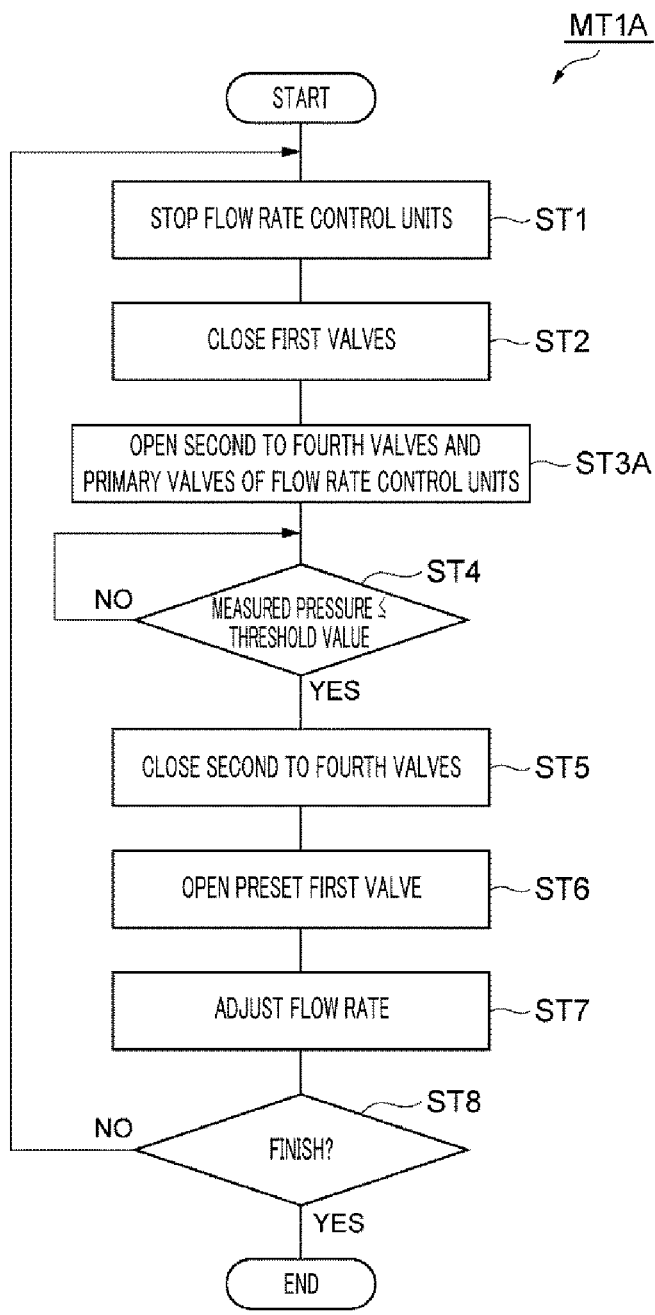
FIG. 13 is a flowchart for describing a modification example of the operation method for the plasma processing apparatus shown in FIG. 3.

Now, a modification example of the operation method for the plasma processing apparatus described in FIG. 3 will be explained. FIG. 13 is a flowchart for describing the modification example of the operation method for the plasma processing apparatus shown in FIG. 3. The operation method MT1A shown in FIG. 13 may be applicable to a case that the flow rate controller FD of the flow rate control unit FU is a pressure type flow rate controller.

Figure 14:
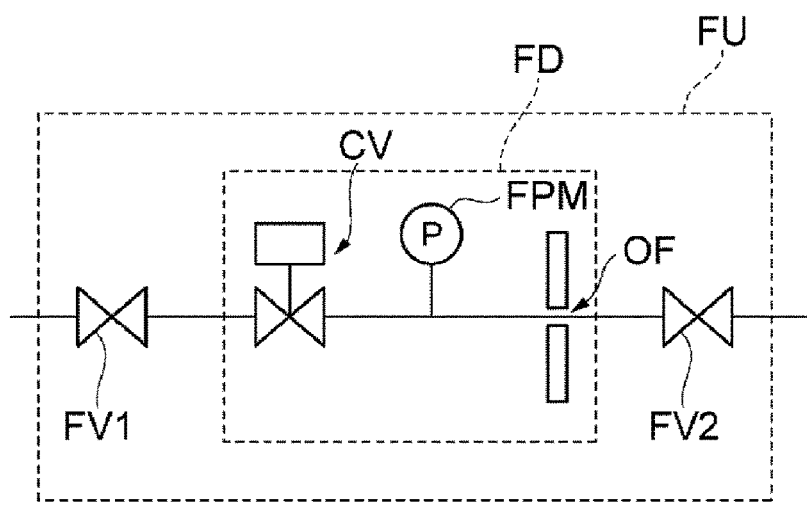
FIG. 14 is a diagram illustrating an example configuration of a pressure type flow rate controller.

FIG. 14 is a diagram illustrating an example of the pressure type flow rate controller. As depicted in FIG. 14, the pressure type flow rate controller FD includes a control valve CV, a pressure gauge FPM and an orifice OF. The control valve CV is provided downstream of the primary valve FV1, and the orifice OF is provided downstream of the control valve CV and upstream of the secondary valve FV2. Further, the pressure gauge FPM is configured to measure a pressure in the gas line between the control valve CV and the orifice OF. The pressure type flow rate controller FD controls the flow rate of the gas based on the principle that the flow rate of the gas passing through the orifice OF is proportionate to the pressure in the gas line at the upstream side of the orifice OF when the pressure in the gas line at the upstream side of the orifice OF is twice as high as the pressure in the gas line at the downstream side of the orifice OF. That is, by controlling the pressure in the gas line at the upstream side of the orifice OF through the control valve CV, the pressure type flow rate controller FD adjusts the flow rate of the gas which flows through the flow rate controller FD.

When changing the flow rate of the gas through this pressure type flow rate controller FD, for example, when changing the flow rate of the gas from a higher flow rate to a lower flow rate through the corresponding flow rate controller FD, it is required to wait for the gas to be exhausted from the orifice OF, and it takes a very long time (hereinafter, referred to as "waiting time") until the flow rate of the gas is stabilized. To shorten this waiting time, it is attempted to reduce the capacity of the gas line at the upstream side of the orifice OF. Reducing the capacity of the gas line, however, requires a change in the design of the flow rate controller, and has a problem that the processing for producing the gas line becomes a difficult micro-processing.

In order to shorten the waiting time, the operation method MT1A shown in FIG. 13 includes a process ST3A instead of the process ST3 of the operation method MT1. To elaborate, in the process ST3A, the valve V2, the valve V3 and all the valves V4 are opened, as in the process ST3, and the primary valve FV1 of each flow rate control unit FU is opened. Accordingly, the gas in the gas line of the flow rate controller FD can be exhausted through the gas exhaust line EL at a high speed. As a result, a response speed of the gas flow rate control by the pressure type flow rate controller FD can be improved.

Figure 4:
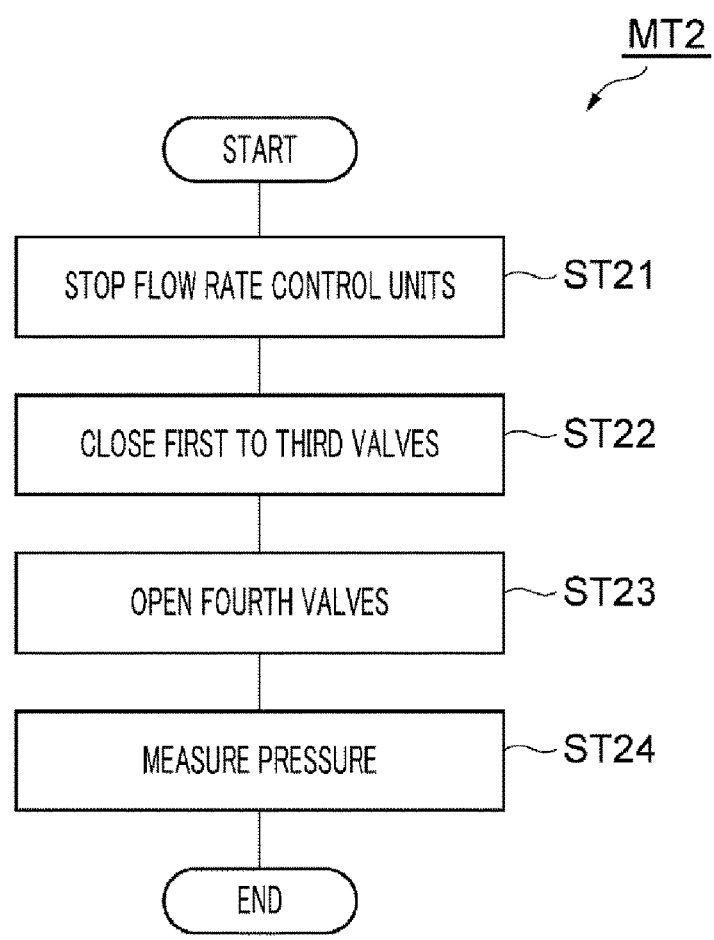
FIG. 4 is a flowchart for describing another example of the operation method for the plasma processing apparatus according to the exemplary embodiment.

Now, another example of the operation method for the plasma processing apparatus 10 will be discussed. FIG. 4 is a flowchart for describing another example of the operation method for the plasma processing apparatus. The operation method MT2 of the plasma processing apparatus shown in FIG. 4 is directed to detecting a leakage of the valves V1. Further, the operation method MT2 may be also applicable to various plasma processing apparatuses to be described later.

In the operation method MT2, to detect a leakage, all the flow rate control units FU are stopped in a process ST21. Then, in a subsequent process ST22, all the valves V1, the valve V2 and the valve V3 are closed. Then, in a process ST23, all the valves V4 are opened. Thereafter, in a process ST24, a pressure of the flow path within the gas exhaust line EL is measured by the pressure gauge PM.

When conducting the pressure measurement in the process ST24, all the valves V1 connected to the gas sources GS, the valve V2 and the valve V3 are closed, and all the flow rate control units FU are stopped. Therefore, unless any valve V1 leaks, there is hardly generated a change in the pressure of the gas exhaust line EL. Accordingly, by detecting a variation in the measurement value of the pressure gauge PM in the process ST24, the leakage of any valve V1 can be detected, if any.

Figure 5:
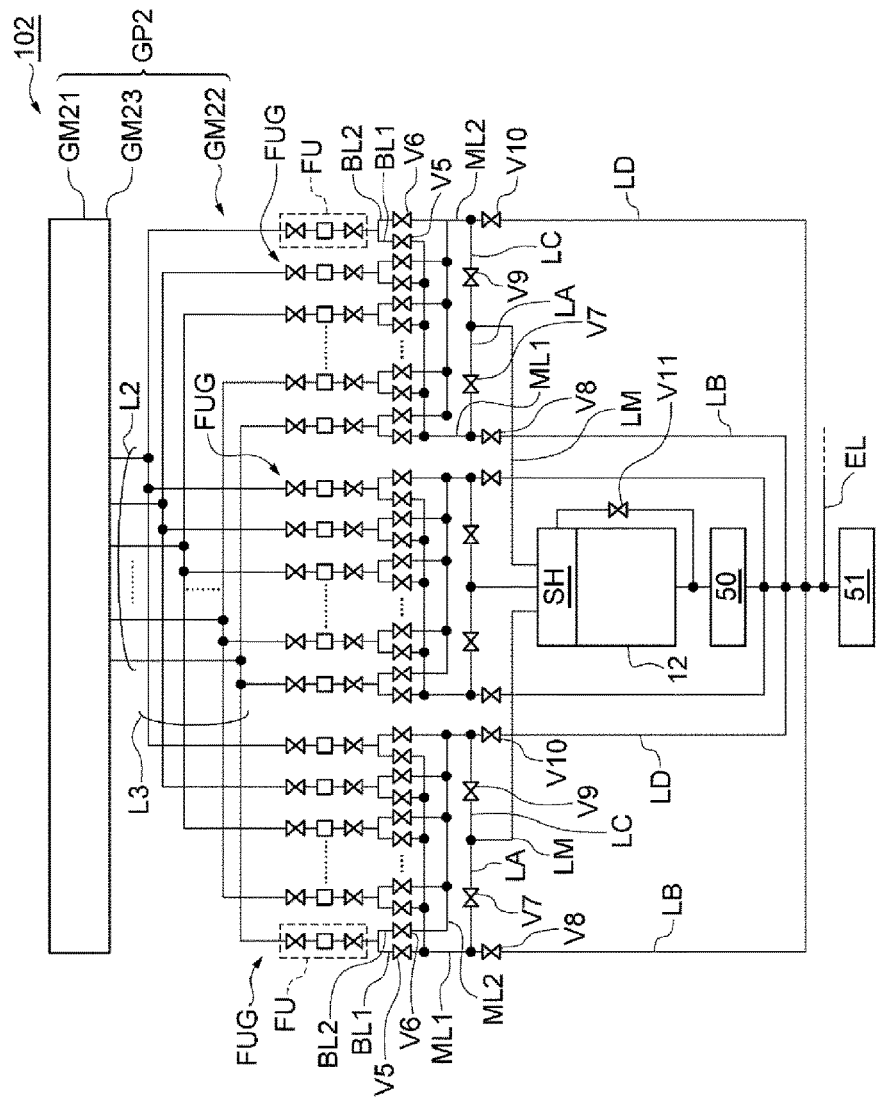
FIG. 5 is a diagram schematically illustrating a plasma processing apparatus according to another exemplary embodiment.

Hereinafter, a gas supply system according to another exemplary embodiment and a plasma processing apparatus including this gas supply system will be explained. FIG. 5 is a diagram schematically illustrating a plasma processing apparatus according to another exemplary embodiment. The plasma processing apparatus 102 shown in FIG. 5 is equipped with components other than the gas supply system GP1 of the plasma processing apparatus 10 shown in FIG. 2, i.e., the processing vessel 12, the shower head SH, the gas exhaust device 50, the gas exhaust device 51, and so forth. Below, the configuration including the components such as the processing vessel, other than the gas supply system, will be referred to as "reactor unit."

Further, the plasma processing apparatus 102 is further equipped with a gas supply system GP2. The gas supply system GP2 includes a first device GM21, a second device GM22 and a third device G23. The first device GM21 is only different from the first device GM1 in that the number of integral units GI belonging to the first device GM21 is larger than the number of the integral units GI belonging to the first device GM1 of the gas supply system GP1. As shown in FIG. 5, multiple pipelines L2 are extended from the first device GM21.

The third device GM23 is different from the third device GM3 of the gas supply system GP1 in that it has the same number of pipelines L4 and valves V4 as the number of the pipelines L2 of the first device GM21. A gas exhaust line EL of the third device GM23 is connected to a pipeline between the gas exhaust device 50 and the gas exhaust device 51, like the gas exhaust line EL of the third device GM3 of the gas supply system GP1.

The second device GM22 includes multiple flow rate control unit groups FUG. In the example shown in FIG. 5, the number of the flow rate control unit groups FUG of the second device GM22 is three, but is not limited thereto. Each of the flow rate control unit groups FUG includes multiple flow rate control units FU. In the second device GM22, the number of the flow rate control units FU belonging to each flow rate control unit group FUG is set to be larger than the number of the flow rate control units FU belonging to each flow rate control unit group FUG of the gas supply system GP1.

The second device GM22 includes multiple branch lines BL1 (first branch lines BL1), multiple branch lines BL2 (second branch lines BL2), multiple valves V5 (fifth valves V5), multiple valves V6 (sixth valves V6), multiple joint lines ML1 (first joint lines ML1) and multiple joint lines ML2 (second joint lines ML2).

The multiple branch lines BL1 are respectively connected to the multiple flow rate control units FU. The multiple branch lines BL2 are also respectively connected to the multiple flow rate control units FU. That is, a pair of the branch lines BL1 and BL2 is branched from an output of each flow rate control unit FU. Each branch line BL1 is provided with a valve V5, and each branch line BL2 is provided with a valve V6.

The multiple joint lines ML1 are configured to merge gases from the multiple branch lines BL1 for each corresponding one of the flow rate control unit groups FUG. That is, connected to the single joint line ML1 are the multiple branch lines BL1 which are respectively connected to the multiple flow rate control units FU within each corresponding one of the flow rate control unit groups FUG. Further, the multiple joint lines ML2 are configured to merge gases from the multiple branch lines BL2 for each corresponding one of the flow rate control unit groups FUG. That is, connected to the single joint line ML2 are the multiple branch lines BL2 which are respectively connected to the multiple flow rate control units FU within each corresponding one of the flow rate control unit groups FUG.

Furthermore, the second device GM22 of the gas supply system GP2 shown in FIG. 5 further includes multiple valves V7 (seventh valves V7), multiple valves V8 (eighth valves V8), multiple valves V9 (ninth valves V9) and multiple valves V10 (tenth valves V10).

Each joint line ML1 is connected to corresponding one of multiple gas discharging units within the shower head SH via the valve V7. Further, each joint line ML1 is connected to a pipeline between the gas exhaust device 50 and the gas exhaust device 51 via the valve V8. That is, each joint line ML1 is branched into a pipeline LA having the valve V7 and a pipeline LB having the valve V8. The pipeline LA joins a pipeline LM, and the pipeline LM is connected to corresponding one of the multiple gas discharging units within the shower head SH. Further, the pipeline LB is connected to the pipeline between the gas exhaust device 50 and the gas exhaust device 51.

Each joint line ML2 is connected to corresponding one of the multiple gas discharging units within the shower head SH via the valve V9. Further, each joint line ML2 is also connected to the pipeline between the gas exhaust device 50 and the gas exhaust device 51 via the valve V10. That is, each joint line ML2 is branched into a pipeline LC having the valve V9 and a pipeline LD having the valve V10. The pipeline LC joins the pipeline LM together with the pipeline LA which guides the gas from the same flow rate control unit group FUG, and the pipeline LM is connected to corresponding one of the multiple gas discharging units within the shower head SH. Further, the pipeline LD is connected to the pipeline between the gas exhaust device 50 and the gas exhaust device 51.

In the present exemplary embodiment, the plasma processing apparatus 102 further includes a valve V11 (eleventh valve V11). The valve V11 is provided at a pipeline connecting the shower head SH and the gas exhaust line 52 (see FIG. 2) which is provided between the processing vessel 12 and the gas exhaust device 50. This valve V11 is opened when the gas within the gas supply system GP2 is exhausted. Accordingly, the gas within the shower head SH is exhausted by the gas exhaust device 50. Therefore, the gas within the shower head SH can also be exhausted at a high speed.

Figure 6:
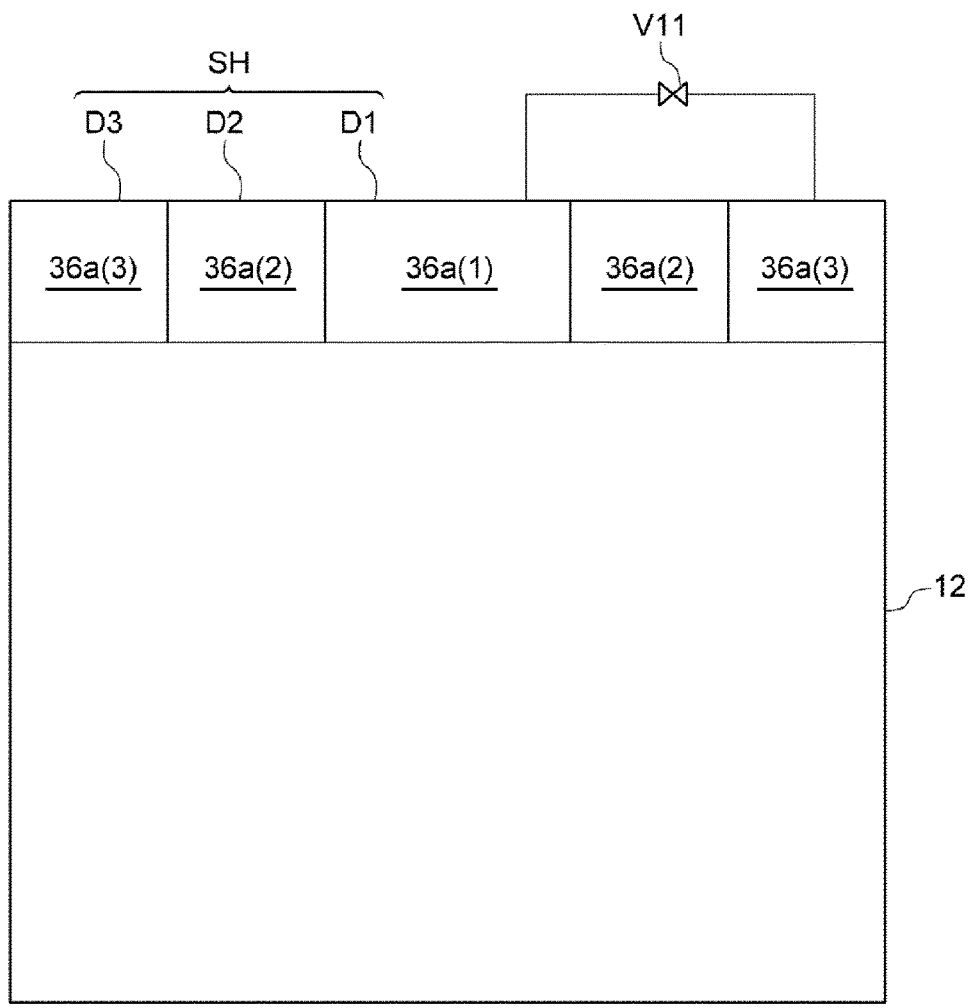
FIG. 6 is a diagram illustrating another example of a valve V11.

FIG. 6 is a diagram illustrating another example of the valve V11. In the exemplary embodiment shown in FIG. 6, the shower head SH includes the multiple gas discharging units, for example, a gas discharging unit D1, a gas discharging unit D2 and a gas discharging unit D3. The gas discharging unit D1 includes a gas diffusion space 36a(1); the gas discharging unit D2 includes a gas diffusion space 36a(2); and the gas discharging unit D3 includes a gas diffusion space 36a(3). In the present exemplary embodiment, the number of the gas discharge holes 34a connected to the gas diffusion space 36a(3) is set to be larger than the number of the gas discharge holes 34a connected to the gas diffusion space 36a(1). Accordingly, a conductance of the gas discharging unit D3 is higher than a conductance of the gas discharging unit D1. To exhaust the gas within the shower head SH having this configuration at a high speed, the gas discharging unit D1 and the gas discharging unit D3 are connected by a pipeline having the valve V11. The valve V11 is opened when the gas within the gas supply system GP2 is exhausted. Accordingly, the gas from the gas discharging unit D1 flows into the gas discharging unit D3, and is exhausted at a high speed through a space within the processing vessel 12.

In the gas supply system GP2, as in the gas supply system GP1, the gas in the flow paths within the gas supply system GP2 can be replaced at a high speed, i.e., in a short time period. Further, from a measurement result of the pressure gauge PM, it can be determined whether the gas remaining within the gas supply system GP2 is completely exhausted. Further, the leakage of the valve V1 within the gas supply system GP2, if any, can also be detected from the measurement result of the pressure gauge PM.

Moreover, in the gas supply system GP2, by opening either one of the valve V5 and the valve V6 respectively provided on the pair of branch lines BL1 and BL2 connected to each flow rate control unit FU, a gas A from some of the multiple flow rate control units FU of each flow rate control unit group FUG can be supplied into the joint line ML1, and a gas B from the other multiple flow rate control units FU can be supplied into the joint line ML2.

According to the plasma processing apparatus 102 equipped with the gas supply system GP2 having the above-described configuration, the gas A from the multiple joint lines ML1 and the gas B from the multiple joint lines ML2 can be supplied into the processing vessel 12 alternately. In this case, the gas A and the gas B are different kinds of gases. Thus, it is possible to improve the throughput of the process in which different kinds of plasma processings are performed on the wafer W alternately.

Furthermore, according to the plasma processing apparatus 102, the gas A may be continuously supplied into the processing vessel 12 from the joint lines ML1, and the gas B may be supplied into the processing vessel 12 from the joint lines ML2 intermittently, that is, in a pulse shape. In such a case, the kind of the gas supplied from the joint lines ML2 may be the same as or different from the kind of the gas supplied from the joint lines ML1.

Figure 7:
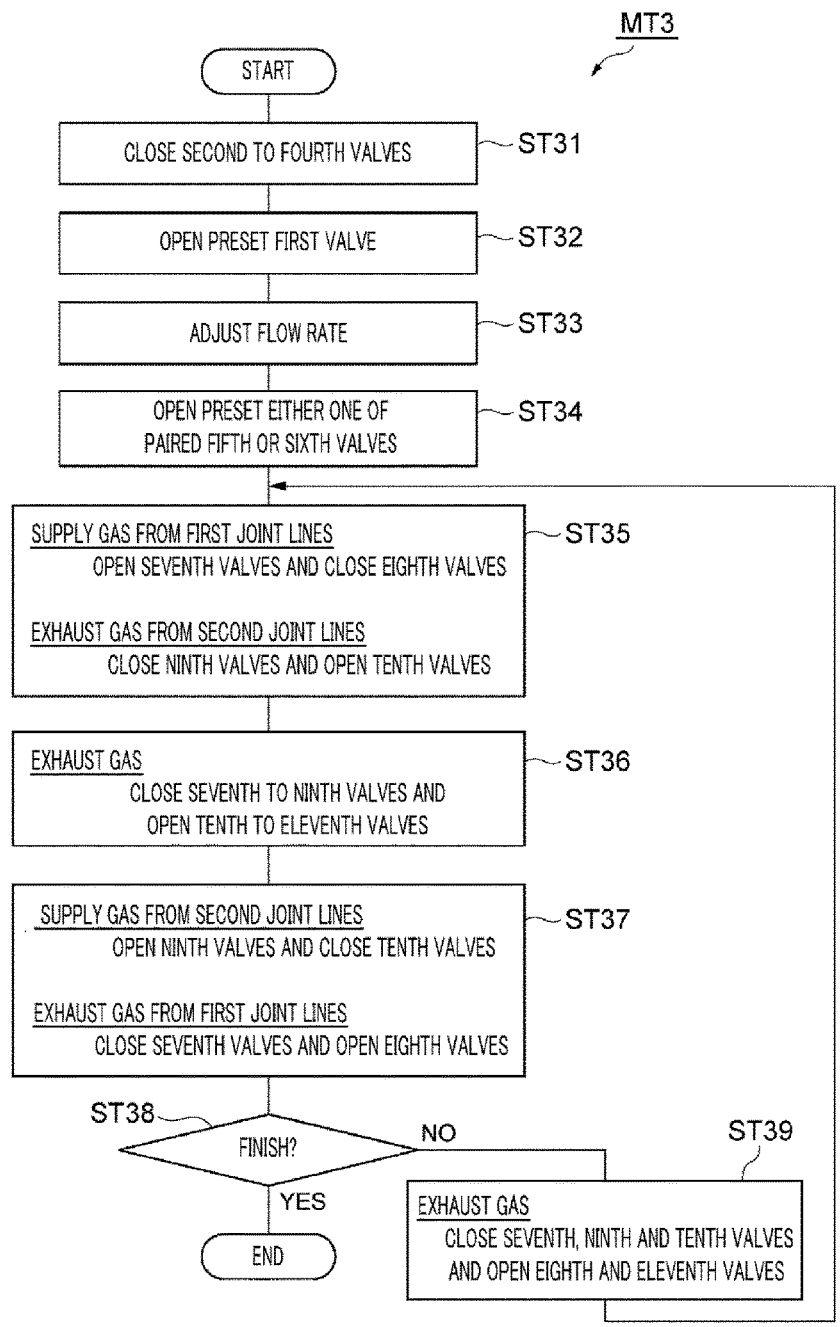
FIG. 7 is a flowchart for describing an example of an operation method for the plasma processing apparatus shown in FIG. 5 or FIG. 6.
Figure 8:
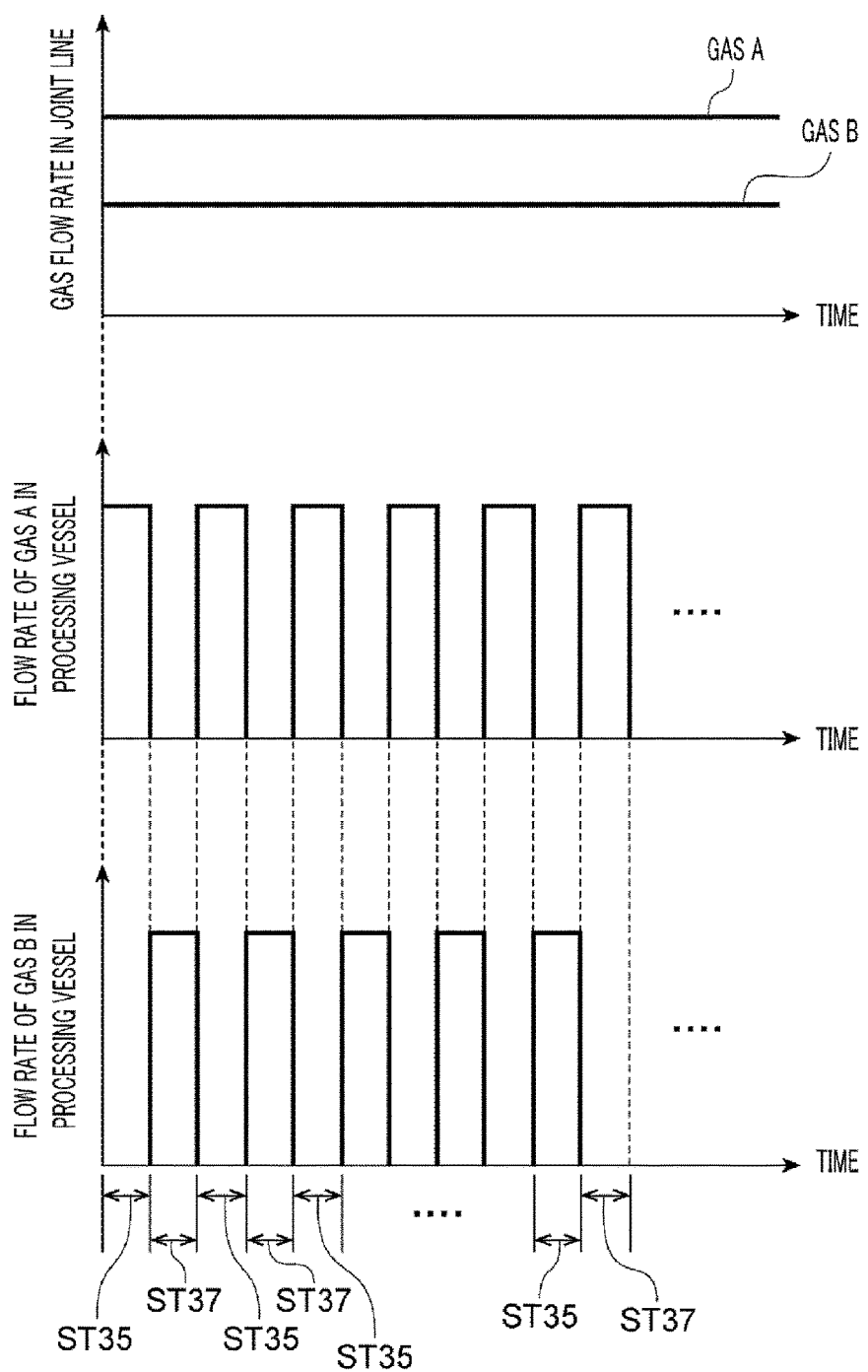
FIG. 8 is a timing chart illustrating flow rates of gases in the operation method shown in FIG. 7.

Now, examples of an operation method for the plasma processing apparatus 102 will be discussed. FIG. 7 is a flowchart for describing an example of the operation method for the plasma processing apparatus shown in FIG. 5 or FIG. 6. The operation method MT3 shown in FIG. 7 is directed to a method in which different kinds of plasma processings are performed alternately within the processing vessel 12 by supplying different kinds of gases into the processing vessel 12 alternately. FIG. 8 is a timing chart illustrating flow rates of the gases in the operation method shown in FIG. 7. An upper timing chart of FIG. 8 is a timing chart illustrating the flow rate of the gas A flowing through the joint line ML1 and the flow rate of the gas B flowing through the joint line ML2 after a process ST33 of the operation method MT3. Further, a middle timing chart of FIG. 8 is a timing chart illustrating the flow rate of the gas A flowing within the processing vessel in processes ST35 and ST37. Further, a lower timing chart of FIG. 8 is a timing chart illustrating the flow rate of the gas B flowing within the processing vessel in the processes ST35 and ST37. Below, description will be provided with reference to FIG. 7 and FIG. 8.

In the operation method MT3, the valve V2, the valve V3 and all of the valves V4 are closed in a process ST31. In a subsequent process ST32, a required valve V1 among the valves V1 is opened. In a subsequent process ST33, the flow rate of the gas is adjusted by the multiple flow rate control units of the multiple flow rate control unit groups FUG. In a subsequent process ST34, either one of the valve V5 and the valve V6, which are respectively provided on the pair of branch lines BL1 and BL2 connected to each flow rate control unit FU, is opened. That is, the gas A is supplied through the joint line ML1 from some of the multiple flow rate control units FU of each flow rate control unit group FUG, and the gas B is supplied through the joint line ML2 from the other flow rate control units FU of each flow rate control unit group FUG. For example, the gas A having the flow rate shown in the upper timing chart of FIG. 8 flows through the joint line ML1, and the gas B having the flow rate shown in the upper timing chart of FIG. 8 flows through the joint line ML2.

In the subsequent process ST35, the multiple valves V7 are opened, and the multiple valves V8 are closed. Further, the multiple valves V9 are closed, and the multiple valves V10 are opened. Accordingly, the gas A from the multiple joint lines ML1 is supplied into the shower head SH through the pipeline LM. Further, the gas B from the multiple joint lines ML2 is exhausted through the pipeline LD. Accordingly, as depicted in the middle and lower timing charts of FIG. 8, only the gas A is supplied into the processing vessel 12. Then, the gas A supplied from the shower head SH is excited, so that a plasma processing is performed on the wafer W.

In a subsequent process ST36, the multiple valves V7, the multiple valves V8 and the multiple valves V9 are closed, and the multiple valves V10 are opened. Accordingly, the supply of the gas A into the shower head SH from the multiple joint lines ML1 is stopped. Further, the gas B from the multiple joint lines ML2 is exhausted through the pipeline LD. Furthermore, the valve V11 is opened. Accordingly, the gas within the shower head SH is exhausted. Then, the valve V11 is closed.

In the subsequent process ST37, the multiple valves V9 are opened, and the multiple valves V10 are closed. Further, the multiple valves V7 are closed, and the multiple valves V8 are opened. Accordingly, the gas B is supplied into the shower head SH from the multiple joint lines ML2 through the pipeline LM. Further, the gas A from the multiple joint lines ML1 is exhausted through the pipeline LB. Accordingly, as depicted in the middle and lower timing charts of FIG. 8, only the gas B is supplied into the processing vessel 12. Then, the gas B supplied from the shower head SH is excited, so that a plasma processing different from the plasma processing in the process ST35 is performed on the wafer W.

In a subsequent process ST38, it is determined whether the alternate repetition of the process ST35 and the process ST37 needs to be finished. By way of example, it is determined whether the process ST35 and the process ST37 are repeated a preset number of times. If it is determined in the process ST38 that the alternate repetition of the process ST35 and the process ST37 is not finished, a process ST39 is performed.

In the process ST39, the multiple valves V7, the multiple valves V9 and the multiple valves V10 are closed, and the multiple valves V8 are opened. Accordingly, the supply of the gas B into the shower head SH from the multiple joint lines ML2 is stopped. Further, the gas A from the multiple joint lines ML1 is exhausted through the pipeline LB. Further, the valve V11 is opened. Accordingly, the gas within the shower head SH is exhausted. Then, the valve V11 is closed, and the processings from the process ST35 are performed again.

Meanwhile, if it is determined in the process ST38 that the alternate repetition of the process ST35 and the process ST37 is finished, the operation method MT3 is ended. Further, to perform the processes ST31 to ST39, the individual components of the plasma processing apparatus 102 related to these processes may be controlled by the controller Cnt. According to the operation method MT3, the gas A from the multiple joint lines ML1 and the gas B from the multiple joint lines ML2 can be supplied into the processing vessel 12 alternately, and the gas which is not currently supplied into the processing vessel 12 can be exhausted to the gas exhaust side. Accordingly, the gas supplied into the processing vessel 12 can be changed at a high speed. Thus, it is possible to improve the throughput of the process in which the different kinds of plasma processings are performed on the wafer W alternately.

Here, examples of the gas A and the gas B used in the operation method MT3 are specified. FIG. 9 is a table which provides examples of the gas A used in the process ST35 and the gas B used in the process ST37. In each process of the table, the gas A and the gas B in dotted cells are meant to be exhausted in the corresponding process, and the gas A and the gas B in non-dotted cells are meant to be supplied into the processing vessel 12 in the corresponding process.

As depicted in FIG. 9, a mixed gas containing an $O_2$ gas, an Ar gas and a $CF_4$ gas may be used as the gas A supplied into the processing vessel 12 in the first time of process ST35, for example. Further, a mixed gas containing an $O_2$ gas, an Ar gas and a $SiCl_4$ gas may be used as the gas B exhausted in the first time of process ST35. Further, in the first time of process ST35, the gas A is configured to etch an etching target layer such as a silicon oxide film, and the gas B is a deposition gas. That is, in the first time of process ST35, the etching target layer is etched, and the deposition gas B may be prepared for the subsequent process ST37.

The gas A exhausted in the subsequent process ST37 is a mixed gas containing an $O_2$ gas and an Ar gas, and the gas B supplied into the processing vessel 12 in the process ST37 is a mixed gas containing an $O_2$ gas, an Ar gas and a $SiCl_4$ gas. That is, in the process ST37, a deposit is formed on the processing target object having the etching target layer, and another gas A can be prepared for the subsequent process ST35.

The gas A supplied into the processing vessel 12 in the subsequent process ST35 is a mixed deposition gas containing an $O_2$ gas and an Ar gas, and the gas B exhausted in the corresponding process ST35 is a mixed gas containing an $O_2$ gas, an Ar gas and a $CF_4$ gas. That is, in the corresponding process ST35, a deposit is formed on the processing target object, and the gas B configured to etch the etching target layer can be prepared.

The gas B supplied into the processing vessel 12 in the subsequent process ST37 is a mixed etching gas containing an $O_2$ gas, an Ar gas and a $CF_4$ gas, and the gas A exhausted in the corresponding process ST37 is a mixed deposition gas containing an $O_2$ gas, an Ar gas and a $SiCl_4$ gas. That is, in the corresponding process ST37, the etching target layer is etched, and the deposition gas A may be prepared for the subsequent process ST35. In the subsequent processes ST35 and ST37, one of the appropriate gas A and the appropriate gas B is supplied into the processing vessel 12 while the other is exhausted.

As stated above, in the present exemplary embodiment, the gas A and the gas B for deposition or etching can be supplied into the processing vessel 12 alternately while being switched at a high speed. Thus, the throughput of the process in which the different kinds of plasma processings are performed on the wafer W alternately can be improved.

Figure 10:
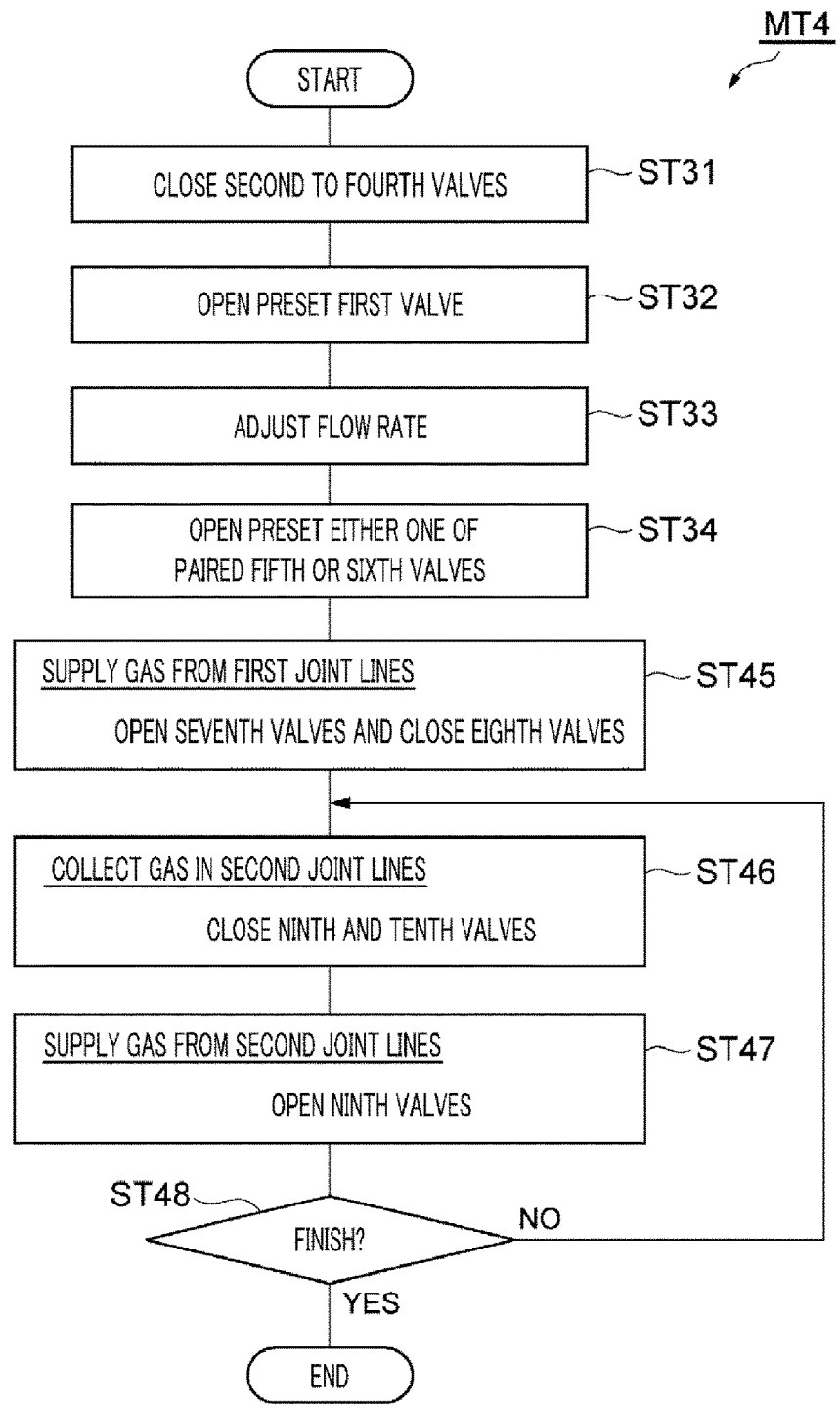
FIG. 10 is a flowchart for describing another example of the operation method for the plasma processing apparatus shown in FIG. 5 or FIG. 6.
Figure 11:
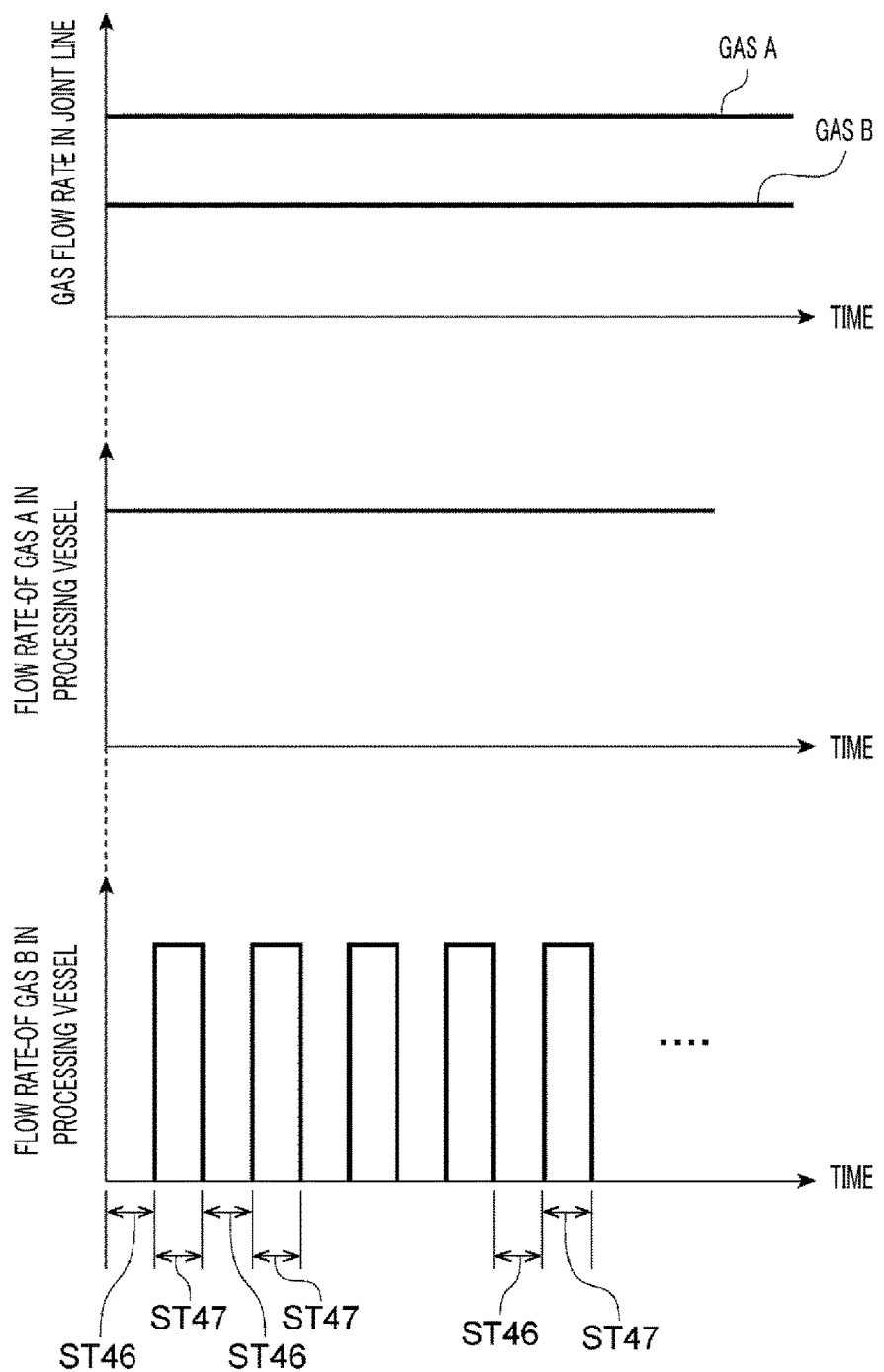
FIG. 11 is a timing chart showing flow rates of gases in the operation method shown in FIG. 10.

Now, another example of the operation method for the plasma processing apparatus shown in FIG. 5 or FIG. 6 will be explained. FIG. 10 is a flowchart for describing another example of the operation method for the plasma processing apparatus shown in FIG. 5 or FIG. 6. The operation method MT4 shown in FIG. 10 is directed to a method in which a plasma processing is performed by supplying the gas A into the processing vessel 12 continuously and supplying the gas B into the processing vessel 12 intermittently, i.e., in the pulse shape. FIG. 11 is a timing chart illustrating flow rates of gases in the operation method shown in FIG. 10. An upper timing chart of FIG. 11 is a timing chart illustrating the flow rate of the gas A flowing through the joint line ML1 and the flow rate of the gas B flowing through the joint line ML2 after a process ST46 of the operation method MT4. Further, a middle timing chart of FIG. 11 is a timing chart illustrating the flow rate of the gas A flowing within the processing vessel 12 in processes ST46 and ST47. Further, a lower timing chart of FIG. 11 is a timing chart illustrating the flow rate of the gas B flowing within the processing vessel 12 in the processes ST46 and ST47. Below, description will be provided with reference to FIG. 10 and FIG. 11.

In the operation method MT4, the same processes as the processes ST31 to ST34 of the operation method MT3 are first performed. In a subsequent process ST45, the multiple valves V7 are opened, and the multiple valves V8 are closed. Accordingly, the gas A from the joint lines ML1 is supplied into the shower head SH. Almost concurrently, the multiple valves V9 and the multiple valves V10 are closed in the process ST46. As a result, the gas B is collected in the flow paths at an upstream side of the valves V9 and the valves V10. At this time, a pressure in the flow paths at the upstream side, i.e., within the flow paths including the joint lines ML2 is higher than a pressure in the flow paths within the joint lines ML1 through which the gas A is flown. During the process ST46, the gas A is excited, and the wafer W is processed by plasma of the gas A.

In the subsequent process ST47, the multiple valves V9 are opened. Accordingly, the gas B collected in the flow paths at the upstream side of the valves V9 and the valves V10 is supplied into the shower head SH, and the gas B is then supplied into the processing vessel 12 from the shower head SH. Then, a mixed gas of the gas A and the gas B are excited, so that the wafer W is processed by plasma of the mixed gas. Further, in the process ST46, since the pressure within the flow paths including the joint lines ML2 through which the gas B is flown is set to a higher pressure, it is possible to supply the gas B having a flow rate lower than that of the gas A into the shower head SH while mixing the gas B in the pipeline LM.

In a subsequent process ST48, it is determined whether the alternate repetition of the process ST46 and the process ST47 needs to be finished. By way of example, it is determined whether the process ST46 and the process ST47 are repeated a preset number of times. If it is determined in the process ST48 that the alternate repetition of the process ST46 and the process ST47 is not finished, the processings from the process ST46 are performed again. Meanwhile, if it is determined that the alternate repetition of the process ST46 and the process ST47 is finished, the operation method MT4 is ended.

According to the operation method MT4, the gas B can be intermittently supplied at a high speed while the gas A is supplied into the processing vessel 12 continuously. Further, the gas A and the gas B may be the same gas or different gases. Therefore, a plasma processing using the gas A and a plasma processing in which the gas B, which is different from the gas A, is added to the gas A can be performed alternately. Moreover, a plasma processing using the gas A and a plasma processing in which the gas B, which is the same as the gas A, is added to the gas A, that is, in which the flow rate of the gas A is increased can be performed alternately.

Figure 12:
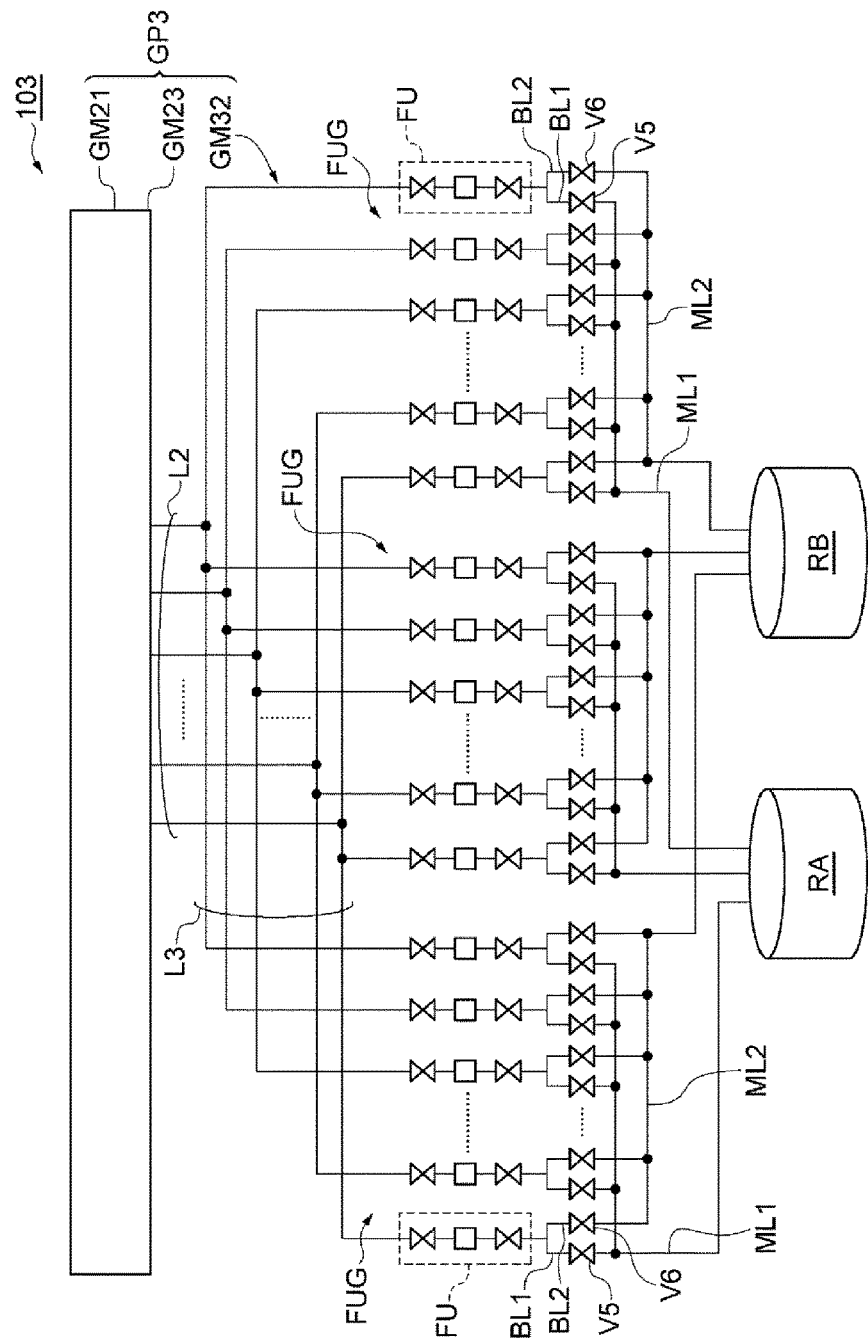
FIG. 12 is a diagram schematically illustrating a plasma processing apparatus 103 according to still another exemplary embodiment.

Now, still another exemplary embodiment will be described. FIG. 12 is a diagram schematically illustrating a plasma processing apparatus 103 according to still another exemplary embodiment. The plasma processing apparatus 103 depicted in FIG. 12 includes a reactor unit RA and a reactor unit RB. The reactor unit RA and the reactor unit RB are the same as the reactor unit of the plasma processing apparatus 10 and the plasma processing apparatus 102.

The plasma processing apparatus 103 further includes a gas supply system GP3. Like the gas supply system GP2, the gas supply system GP3 is equipped with the first device GM21 and the third device GM23. The gas supply system GP3 further includes a second device GM32. Further, in the plasma processing apparatus 102, the joint lines ML1 and the joint lines ML2 of the second device GM22 are connected to the shower head SH of the single reactor unit. However, in the plasma processing apparatus 103, multiple joint lines ML1 of the second device GM32 are respectively connected to the multiple gas discharging units of the shower head SH of the reactor unit RA, and multiple joint lines ML2 are respectively connected to multiple gas discharging units of the shower head SH of the reactor unit RB.

Further, in the plasma processing apparatus 103, the gas exhaust line EL of the third device GM23 may be connected to the pipeline between the gas exhaust device 50 and the gas exhaust device 51 of the reactor unit RA or the pipeline between the gas exhaust device 50 and the gas exhaust device 51 of the reactor unit RB.

In the plasma processing apparatus 103 as stated above, by using the single gas supply system GP3, the gas A can be supplied into the processing vessel 12 of the reactor unit RA and the gas B can be supplied into the processing vessel 12 of the rector unit RB. The gas A and the gas B may be the same gas or different gases. In case that the gas A and the gas B are of different kinds, different kinds of plasma processings can be performed in the reactor unit RA and the reactor unit RB. Meanwhile, if the gas A and the gas B are the same kind of gas, same plasma processing can be performed in the reactor unit RA and the reactor unit RB.

In the above, the various exemplary embodiments have been described. However, the exemplary embodiments are not limiting, and various changes and modifications may be made. For example, in the above-described exemplary embodiments, each plasma processing apparatus is configured as the capacitively coupled plasma processing apparatus. However, the inventive concept of the present disclosure may also be applicable to various other types of plasma processing apparatuses such as an inductively coupled plasma processing apparatus, a plasma processing apparatus using a microwave as a plasma source, and so forth. Furthermore, in each of the plasma processing apparatuses, the gas discharging units are provided in the form of the shower head. However, the gas discharging units may be provided in any forms as long as they are configured to supply the gas toward different zones within the processing vessel, i.e., multiple regions on the processing target object.

EXPLANATION OF REFERENCE NUMERALS

GP1, GP2, GP3: Gas supply system
GM1, GM21: First device
GI: Integral unit
L1: Pipeline (First pipeline)
V2: Valve (First valve)
L2: Pipeline (Second pipeline)
GM2, GM22, GM32: Second device
L3: Pipeline (Third pipeline)
FUG: Flow rate control unit group
FU: Flow rate control unit
BL1: Branch line (First branch line)
BL2: Branch line (Second branch line)
V5: Valve (Fifth valve)
V6: Valve (Sixth valve)
ML: Joint line
ML1: Joint line (First joint line)
ML2: Joint line (Second joint line)
V7: Valve (Seventh valve)
V8: Valve (Eighth valve)
V9: Valve (Ninth valve)
V10: Valve (Tenth valve)
LA, LB, LC, LD, LM: Pipeline
GM3, GM23: Third device
EL: Gas exhaust line
V2: Valve (Second valve)
V3: Valve (Third valve)
L4: Pipeline
V4: Valve (Fourth valve)
PM: Pressure gauge
V11: Valve (Eleventh valve)
GS: Gas source
GSP: Gas source
10, 102, 103: Plasma processing apparatus
12: Processing vessel
PD: Mounting table
LE: Lower electrode
ESC: Electrostatic chuck
30: Upper electrode
SH: Shower head
34*a*: Gas discharge hole
36*a*: Gas diffusion space
D1, D2, D3: Gas discharging unit
50: Gas exhaust device
51: Gas exhaust device
52: Gas exhaust line
62: High frequency power supply
64: High frequency power supply

We claim:

1. A gas supply system of supplying a gas into a plasma processing apparatus, comprising:
a first device including a plurality of integral units each of which is configured to select one or more gases from one or more gas sources and supply the selected gases;
a second device configured to distribute plural gases from the integral units and supply the distributed gases while controlling flow rates of the distributed gases; and
a third device configured to exhaust the gases from the gas supply system; and
a controller configured to control the first device, the second device and the third device,
wherein the first device comprises:
a plurality of first pipelines respectively connected to the gas sources;
a plurality of first valves respectively provided at the first pipelines; and
a multiplicity of second pipelines, the number of the second pipelines being smaller than the number of the first pipelines,
wherein each of the integral units comprises:
a single second pipeline among the second pipelines;
one or more first pipelines, among the first pipelines, which are branched from the single second pipeline and respectively connected to one or more gas sources; and
one or more first valves, among the first valves, which are provided at the one or more first pipelines,
wherein the second device comprises:
a plurality of flow rate control unit groups each having multiple flow rate control units, the number of the flow rate control units being equal to the number of the second pipelines; and
a multiplicity of third pipelines through which the gases from the second pipelines are distributed into corresponding flow rate control units of each of the flow rate control unit groups,
wherein the third device comprises:
a gas exhaust line equipped with a second valve connected to a source of a purge gas and a third valve connected to a gas exhaust device;
a multiplicity of fourth pipelines configured to connect the gas exhaust line and the second pipelines individually between the second valve and the third valve; and
a multiplicity of fourth valves respectively provided at the fourth pipelines,
wherein the controller is further configured to, when changing gases to be supplied from the gas supply system, close all the first valves and open the second valve, the third valve and all the fourth valves.

2. The gas supply system of claim 1,
wherein the second device further comprises a plurality of joint lines respectively connected to the flow rate control unit groups and each configured to merge the gases from the flow rate control units for the corresponding flow rate control unit group.

3. The gas supply system of claim 1,
wherein the second device further comprises:
a multiplicity of first branch lines respectively connected to the flow rate control units;
a multiplicity of second branch lines respectively connected to the flow rate control units;
a multiplicity of fifth valves respectively provided at the first branch lines;
a multiplicity of sixth valves respectively provided at the second branch lines;
a plurality of first joint lines respectively connected to the flow rate control unit groups and each configured to merge the gases from the first branch lines for the corresponding flow rate control unit group; and a plurality of second joint lines respectively connected to the flow rate control unit groups and each configured to merge the gases from the second branch lines for the corresponding flow rate control unit group.

4. The gas supply system of claim 1, further comprising: a pressure gauge connected to the gas exhaust line.

5. The gas supply system of claim 4, wherein the pressure gauge is connected to the gas exhaust line at an upstream side of the third valve.

6. A plasma processing apparatus which performs a plasma processing on a processing target object, comprising:
a gas supply system as claimed in claim 2;
a processing vessel in which a space for accommodating the processing target object therein is provided; and
a plurality of gas discharging units configured to discharge gases into a plurality of zones within the processing vessel, the number of the zones being equal to the number of the flow rate control unit groups,
wherein the joint lines are respectively connected to the gas discharging units.

7. The plasma processing apparatus of claim 6, further comprising:
a turbo molecular pump connected to the processing vessel; and
a dry pump provided downstream of the turbo molecular pump,
wherein the gas exhaust line is connected to a pipeline between the turbo molecular pump and the dry pump at a downstream side of the third valve.

8. A plasma processing apparatus which performs a plasma processing on a processing target object, comprising:
a gas supply system as claimed in claim 3;
a processing vessel in which a space for accommodating the processing target object therein is provided;
a plurality of gas discharging units configured to discharge gases into a plurality of zones within the processing vessel, the number of the zones being equal to the number of the flow rate control unit groups;
a turbo molecular pump connected to the processing vessel; and
a dry pump provided downstream of the turbo molecular pump,
wherein the first joint lines are respectively connected to the gas discharging units via a plurality of seventh valves and respectively connected to a pipeline between the turbo molecular pump and the dry pump via a plurality of eighth valves, and
the second joint lines are respectively connected to the gas discharging units via a plurality of ninth valves and respectively connected to the pipeline between the turbo molecular pump and the dry pump via a plurality of tenth valves.

9. The plasma processing apparatus of claim 8, further comprising:
a shower head provided with the gas discharging units; and
another gas exhaust line, having an eleventh valve, connected to the shower head and to a pipeline between the processing vessel and the turbo molecular pump.

10. The plasma processing apparatus of claim 8, further comprising:
another gas exhaust line, having an eleventh valve, configured to connect a first gas discharging unit among the gas discharging units and a second gas discharging unit, among the gas discharging units, having a conductance higher than a conductance of the first gas discharging unit.

11. A plasma processing apparatus which performs a plasma processing on a processing target object, comprising:
a first processing vessel in which a space for accommodating the processing target object therein is provided;
a second processing vessel in which a space for accommodating the processing target object therein is provided;
a plurality of gas discharging units configured to discharge gases into a plurality of zones within the first processing vessel;
a plurality of other gas discharging units configured to discharge gases into a plurality of zones within the second processing vessel; and
a gas supply system as claimed in claim 3,
wherein the first joint lines are respectively connected to the gas discharging units, and
the second joint lines are respectively connected to the other gas discharging units.

12. The plasma processing apparatus of claim 11, further comprising:
a first turbo molecular pump connected to the first processing vessel;
a first dry pump provided downstream of the first turbo molecular pump;
a second turbo molecular pump connected to the second processing vessel; and
a second dry pump provided downstream of the second turbo molecular pump,
wherein the gas exhaust line is connected, at a downstream side of the third valve, to a pipeline between the first turbo molecular pump and the first dry pump, or to a pipeline between the second turbo molecular pump and the second dry pump.

13. The plasma processing apparatus of claim 6, wherein the gas supply system further comprises a pressure gauge connected to the gas exhaust line.

14. The plasma processing apparatus of claim 13, wherein the pressure gauge is connected to the gas exhaust line at an upstream side of the third valve.

15. An operation method of replacing a gas within a gas supply system supplying gas into a plasma processing apparatus which performs a plasma processing on a processing target object, the plasma processing apparatus comprising:
the gas supply system;
a processing vessel in which a space for accommodating the processing target object therein is provided; and
a plurality of gas discharging units configured to discharge gases into a plurality of zones within the processing vessel, the number of the zones being equal to the number of the flow rate control unit groups,
wherein the gas supply system comprises:
a first device including a plurality of integral units each of which is configured to select one or more gases from one or more gas sources and supply the selected gases;
a second device configured to distribute plural gases from the integral units and supply the distributed gases while controlling flow rates of the distributed gases; and
a third device configured to exhaust the gases from the gas supply system,
wherein the first device comprises:
a plurality of first pipelines respectively connected to the gas sources;
a plurality of first valves respectively provided at the first pipelines; and a multiplicity of second pipelines, the number of the second pipelines being smaller than the number of the first pipelines, wherein each of the integral units comprises:
a single second pipeline among the second pipelines;
one or more first pipelines, among the first pipelines, which are branched from the single second pipeline and respectively connected to one or more gas sources; and
one or more first valves, among the first valves, which are provided at the one or more first pipelines, wherein the second device comprises:
a plurality of flow rate control unit groups each having multiple flow rate control units, the number of the flow rate control units being equal to the number of the second pipelines; and
a multiplicity of third pipelines through which the gases from the second pipelines are distributed into corresponding flow rate control units of each of the flow rate control unit groups, wherein the third device comprises:
a gas exhaust line equipped with a second valve connected to a source of a purge gas and a third valve connected to a gas exhaust device;
a multiplicity of fourth pipelines configured to connect the gas exhaust line and the second pipelines individually between the second valve and the third valve; and
a multiplicity of fourth valves respectively provided at the fourth pipelines wherein the second device further comprises a plurality of joint lines respectively connected to the flow rate control unit groups and each configured to merge the gases from the flow rate control units for the corresponding flow rate control unit group;

wherein the joint lines are respectively connected to the gas discharging units, wherein the gas supply system of the plasma processing apparatus further comprises a pressure gauge connected to the gas exhaust line, and wherein the operation method comprises:
stopping the flow rate control units;
closing the first valves;
opening the second valve, the third valve and the fourth valves;
closing the second valve, the third valve and the fourth valves when a pressure of the gas exhaust line measured by the pressure gauge is equal to or less than a threshold value;
opening a first valve, among the first valves, which is connected to a preset gas source; and
controlling a flow rate of a gas by the flow rate control units.

16. An operation method of detecting a leakage of the first valves in a plasma processing apparatus which performs a plasma processing on a processing target object, the plasma processing apparatus comprising:
the gas supply system;
a processing vessel in which a space for accommodating the processing target object therein is provided; and
a plurality of gas discharging units configured to discharge gases into a plurality of zones within the processing vessel, the number of the zones being equal to the number of the flow rate control unit groups, wherein the gas supply system comprises:
a first device including a plurality of integral units each of which is configured to select one or more gases from one or more gas sources and supply the selected gases;
a second device configured to distribute plural gases from the integral units and supply the distributed gases while controlling flow rates of the distributed gases; and
a third device configured to exhaust the gases from the gas supply system, wherein the first device comprises:
a plurality of first pipelines respectively connected to the gas sources;
a plurality of first valves respectively provided at the first pipelines; and
a multiplicity of second pipelines, the number of the second pipelines being smaller than the number of the first pipelines, wherein each of the integral units comprises:
a single second pipeline among the second pipelines;
one or more first pipelines, among the first pipelines, which are branched from the single second pipeline and respectively connected to one or more gas sources; and
one or more first valves, among the first valves, which are provided at the one or more first pipelines, wherein the second device comprises:
a plurality of flow rate control unit groups each having multiple flow rate control units, the number of the flow rate control units being equal to the number of the second pipelines; and
a multiplicity of third pipelines through which the gases from the second pipelines are distributed into corresponding flow rate control units of each of the flow rate control unit groups, wherein the third device comprises:
a gas exhaust line equipped with a second valve connected to a source of a purge gas and a third valve connected to a gas exhaust device;
a multiplicity of fourth pipelines configured to connect the gas exhaust line and the second pipelines individually between the second valve and the third valve; and
a multiplicity of fourth valves respectively provided at the fourth pipelines wherein the second device further comprises a plurality of joint lines respectively connected to the flow rate control unit groups and each configured to merge the gases from the flow rate control units for the corresponding flow rate control unit group;

wherein the joint lines are respectively connected to the gas discharging units, wherein the gas supply system further comprises a pressure gauge connected to the gas exhaust line, and the pressure gauge is connected to the gas exhaust line at an upstream side of the third valve, and wherein the operation method comprises:
stopping the flow rate control units;
closing the first valves, the second valve and the third valve;
opening the fourth valves; and
measuring a pressure of the gas exhaust line by the pressure gauge.

17. An operation method for a plasma processing apparatus as claimed in claim 8, comprising:
a first process of closing the second valve, the third valve and the fourth valves;

a second process of opening a preset first valve among the first valves;

a third process of adjusting a flow rate of a gas by the flow rate control units;

a fourth process of opening either one of the fifth valve provided at each of the first branch lines or the sixth valve provided at each of the second branch lines, each of the first branch line and the second branch line being connected to corresponding one of the flow rate control units;

a fifth process of opening the seventh valves while closing the eighth valves, and closing the ninth valves while opening the tenth valves; and a sixth process of opening the ninth valves while closing the tenth valves, and closing the seventh valves while opening the eighth valves, wherein the fifth process and the sixth process are repeated alternately.

18. The operation method of claim 17, wherein the plasma processing apparatus further comprises:

a shower head provided with the gas discharging units; and another gas exhaust line, having an eleventh valve, connected to the shower head and to a pipeline between the processing vessel and the turbo molecular pump, and wherein the operation method further comprises:

a seventh process of closing the seventh valves, the eighth valves and the ninth valves while opening the tenth valves and the eleventh valve after the fifth process and before the sixth process, and an eighth process of closing the seventh valves, the ninth valves and the tenth valves while opening the eighth valves and the eleventh valve after the sixth process and before the fifth process.

19. The operation method of claim 17, wherein the plasma processing apparatus further comprises another gas exhaust line, having an eleventh valve, configured to connect a first gas discharging unit among the gas discharging units and a second gas discharging unit, among the gas discharging units, having a conductance higher than a conductance of the first gas discharging unit, and wherein the operation method further comprises:

a seventh process of closing the seventh valves, the eighth valves and the ninth valves while opening the tenth valves and the eleventh valve after the fifth process and before the sixth process, and an eighth process of closing the seventh valves, the ninth valves and the tenth valves while opening the eighth valves and the eleventh valve after the sixth process and before the fifth process.

20. An operation method for a plasma processing apparatus as claimed in claim 8, comprising:

a first process of closing the second valve, the third valve and the fourth valves;

a second process of opening a preset first valve among the first valves;

a third process of adjusting a flow rate of a gas by the flow rate control units;

a fourth process of opening either one of the fifth valve provided at each of the first branch lines or the sixth valve provided at each of the second branch lines, each of the first branch line and the second branch line being connected to corresponding one of the flow rate control units;

a fifth process of opening the seventh valves while closing the eighth valves;

a sixth process of closing the ninth valves and the tenth valves; and a seventh process of opening the ninth valves, wherein the sixth process and the seventh process are repeated alternately.

21. The operation method of claim 15, wherein, in the opening of the second valve, the third valve and the fourth valves, primary valves provided in the flow rate control units are further opened.

* * * * *